United States Patent
Harari et al.

(10) Patent No.: US 8,546,239 B2
(45) Date of Patent: Oct. 1, 2013

(54) METHODS OF FABRICATING NON-VOLATILE MEMORY WITH AIR GAPS

(75) Inventors: Eli Harari, Saratoga, CA (US); Tuan Pham, San Jose, CA (US); Yupin Fong, Fremont, CA (US); Vinod Robert Purayath, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 105 days.

(21) Appl. No.: 13/157,178

(22) Filed: Jun. 9, 2011

(65) Prior Publication Data
US 2011/0303967 A1    Dec. 15, 2011

Related U.S. Application Data

(60) Provisional application No. 61/354,094, filed on Jun. 11, 2010.

(51) Int. Cl.
*H01L 21/76* (2006.01)
(52) U.S. Cl.
USPC .......................................... 438/421; 257/321
(58) Field of Classification Search
USPC .............. 438/421; 257/321, E29.3, E21.573
See application file for complete search history.

(56) References Cited

U.S. PATENT DOCUMENTS

| | | | |
|---|---|---|---|
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,863,190 B1 | 1/2011 | Papasouliotis | |
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,362,542 B2 | 1/2013 | Kang et al. | |
| 8,383,479 B2 | 2/2013 | Purayath | |
| 2006/0194390 A1 | 8/2006 | Imai et al. | |
| 2007/0184615 A1 | 8/2007 | Brazzelli et al. | |
| 2007/0257305 A1* | 11/2007 | Sasago et al. | 257/316 |
| 2008/0003743 A1 | 1/2008 | Lee | |
| 2008/0283898 A1* | 11/2008 | Kuniya | 257/316 |
| 2009/0212352 A1 | 8/2009 | Aoyama et al. | |
| 2009/0267131 A1 | 10/2009 | Nitta | |

(Continued)

FOREIGN PATENT DOCUMENTS

EP    1835530 A2    9/2007

OTHER PUBLICATIONS

International Search Report & The Written Opinion of the International Searching Authority dated Sep. 16, 2011, International Patent Application No. PCT/US2011/039955.

(Continued)

*Primary Examiner* — Phuc Dang
(74) *Attorney, Agent, or Firm* — Vierra Magen Marcus LLP

(57) ABSTRACT

Air gap isolation in non-volatile memory arrays and related fabrication processes are provided. Electrical isolation can be provided, at least in part, by bit line air gaps that are elongated in a column direction and/or word line air gaps that are elongated in a row direction. The bit line air gaps may be formed in the substrate, extending between adjacent active areas of the substrate, as well as above the substrate surface, extending between adjacent columns of non-volatile storage elements. The word line air gaps may be formed above the substrate surface, extending between adjacent rows of non-volatile storage elements.

38 Claims, 20 Drawing Sheets

(56) References Cited

U.S. PATENT DOCUMENTS

2010/0019311 A1    1/2010    Sato et al.
2010/0127320 A1    5/2010    Nishihara et al.
2010/0230741 A1*    9/2010    Choi et al. .................... 257/324
2011/0057250 A1    3/2011    Higashi

OTHER PUBLICATIONS

Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.1.4.

Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.

U.S. Appl. No. 13/162,550, filed Jun. 16, 2011.
U.S. Appl. No. 13/162,475, filed Jun. 16, 2011.
U.S. Appl. No. 13/163,538, filed Jun. 17, 2011.
International Preliminary Report on Patentability dated Dec. 14, 2012, International Application No. PCT/US2011/039955.

* cited by examiner

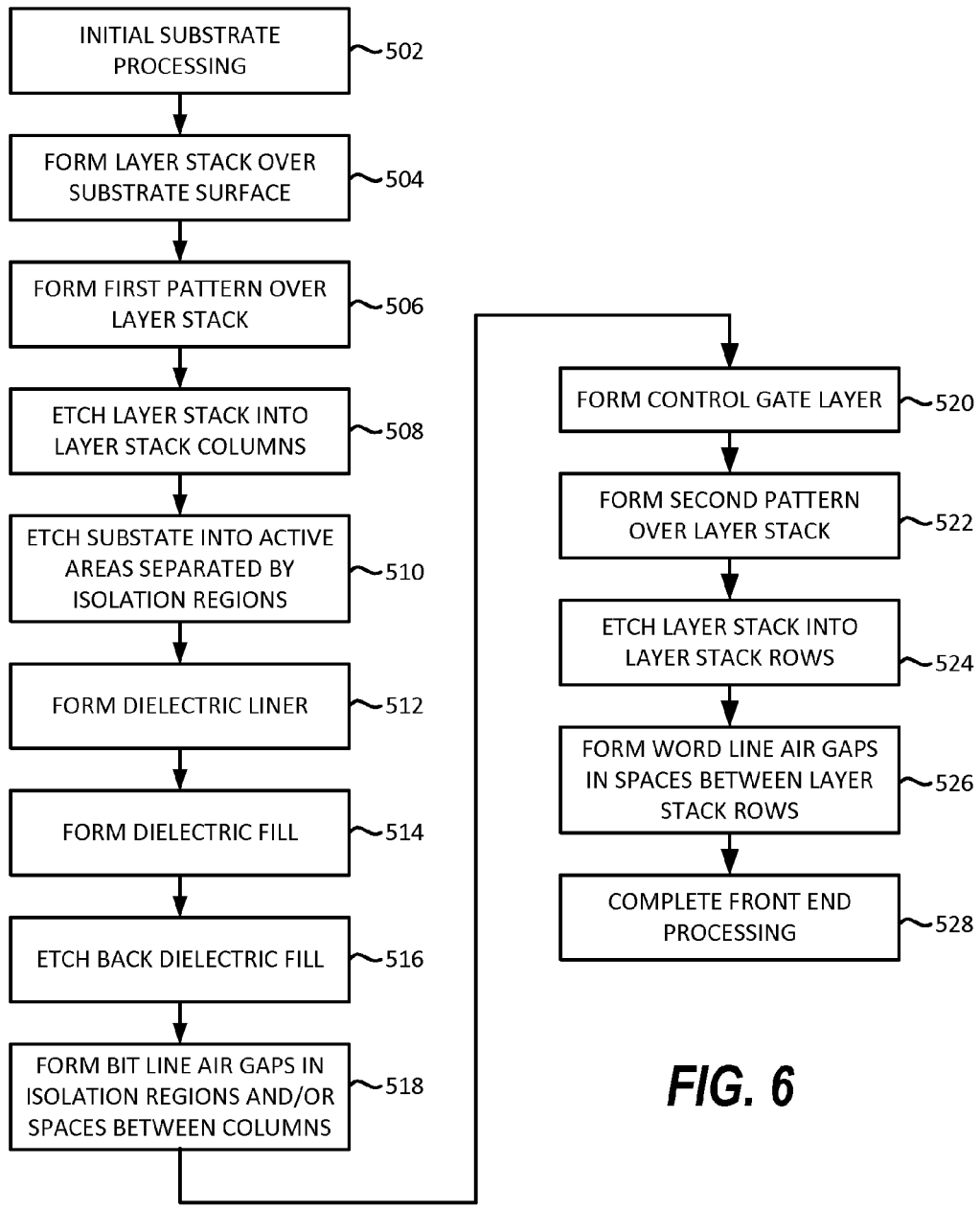

METHODS OF FABRICATING NON-VOLATILE MEMORY WITH AIR GAPS

The present application claims priority from U.S. Provisional Patent Application No. 61/354,094, entitled "Non-Volatile Memory with Air Gaps," by Harari, et al., filed Jun. 11, 2010, incorporated by reference herein in its entirety.

BACKGROUND OF THE INVENTION

1. Field of the Disclosure

Embodiments of the present disclosure are directed to high density semiconductor devices, such as non-volatile storage, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

BRIEF DESCRIPTION OF THE DRAWINGS

FIG. 6 is a flowchart describing a method of forming bit line and word line air gaps in accordance with one embodiment of the disclosure.

DETAILED DESCRIPTION

Figure 1:
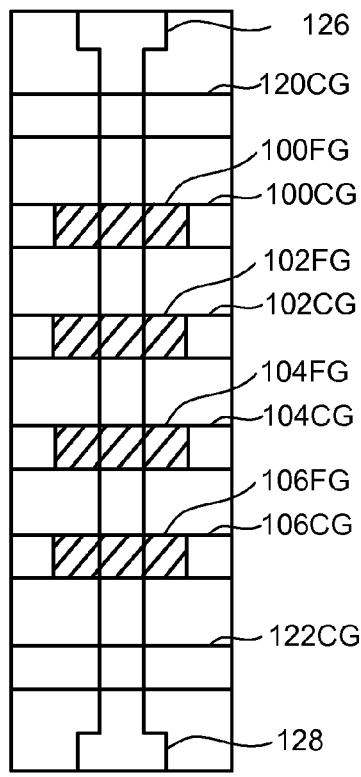
FIG. 1 is a top view of a NAND string.
Figure 2:
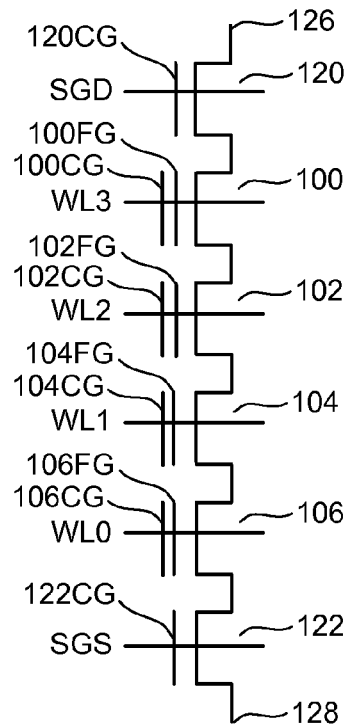
FIG. 2 is an equivalent circuit diagram of the NAND string depicted in FIG. 1.

Embodiments of the present disclosure are directed to high-density semiconductor memory, and more particularly to electrical isolation between discrete devices in non-volatile memory. Electrical isolation is provided, at least in part, by air gaps that are formed in the column (bit line) direction and/or air gaps that are formed in the row (word line) direction. Non-volatile memory arrays and related methods of fabrication are provided.

The air gaps formed in the column direction, referred to as bit line air gaps, can provide electrical isolation between devices adjacent in the row direction. For example, adjacent columns of non-volatile storage elements, such as adjacent strings in a NAND type non-volatile memory, can be isolated using air gaps that are formed in the substrate between active areas underlying the adjacent columns. Although principally described with respect to NAND type non-volatile memory, it will be understood that the various air gaps described herein can be utilized in other arrays utilizing column and/or row arrangements for storage elements.

The dimensions of the bit line air gaps may vary according to the specifications for individual implementations. In one embodiment, the bit line air gaps are formed entirely below the substrate surface, extending vertically, with respect to the substrate surface, only within isolation regions formed within the substrate. In other embodiments, the bit line air gaps may extend above the surface of the substrate to at least partially occupy the area between adjacent columns of storage elements that are formed above adjacent active areas of the substrate. In one embodiment, the bit line air gaps may be formed exclusively above the substrate surface.

In the isolation regions, the bit line air gaps may extend to the bottom of the isolation region or less than all of the way to the bottom. Liners, partial fills and/or other material that may enter the isolation regions during the fabrication process may occupy part of the isolation region. Above the substrate surface, the bit line air gaps may extend any desired distance above the surface. For example, the air gap may extend to the level of the upper surface of the tunnel dielectric layer in one example. In another example, the air gaps may extend vertically to the level of the lower surface of the intermediate dielectric layer. In another example, the air gaps may extend to a level of the lower surface of the control gate layer.

In the row direction, the bit line air gaps may extend the full distance between the isolation region sidewalls or some portion thereof, for example where a liner or partial dielectric fill is used. Likewise, above the substrate surface, the air gaps may extend the full distance between adjacent columns of storage elements or some portion thereof, for example where a liner, spacer or partial dielectric fill is used.

In the column direction, the bit line air gaps may extend the length of a column of storage elements, such as may be formed for a block of NAND non-volatile storage elements. The air gaps may extend beyond an entire column or less than the entire length of a column.

The air gaps formed in the row direction, referred to as word line air gaps, can provide electrical isolation between devices adjacent in the column direction. For example, adjacent rows of non-volatile storage elements such as the non-volatile storage elements associated with adjacent word lines in a NAND type non-volatile memory can be isolated using air gaps that are formed above the substrate between adjacent rows of storage elements.

The dimensions of the word line air gaps may vary according to the specifications for individual implementations. In one embodiment, the bit line air gaps are formed entirely above the substrate surface. These air gaps may extend above the surface of the substrate to at least partially occupy the area between adjacent rows of storage elements.

In one embodiment, the lower portions of the word line air gaps extend to the level of the substrate surface. In another embodiment, the lower portions only extend to the level of the upper surface of the tunnel dielectric layer. The upper portions of the word line air gaps may extend any desired distance above the substrate surface. In another example, the air gaps may extend vertically to the level of the lower surface of the intermediate dielectric layer. In another example, the air gaps may extend to a level of the lower surface of the control gate layer. In another example, the air gaps may extend to a level of the upper surface of the control gate layer or further.

In the column direction, the word line air gaps may extend the full distance between adjacent rows of storage elements or some portion thereof, for example where a liner, spacer or partial dielectric fill is used. In the row direction, the word line air gaps may extend the length of a row of storage elements, such as may be formed for a block of NAND non-volatile storage elements. Each non-volatile storage element of a row may be coupled to a common word line. The air gaps may extend beyond an entire row or less than the entire length of a row.

Figure 3:
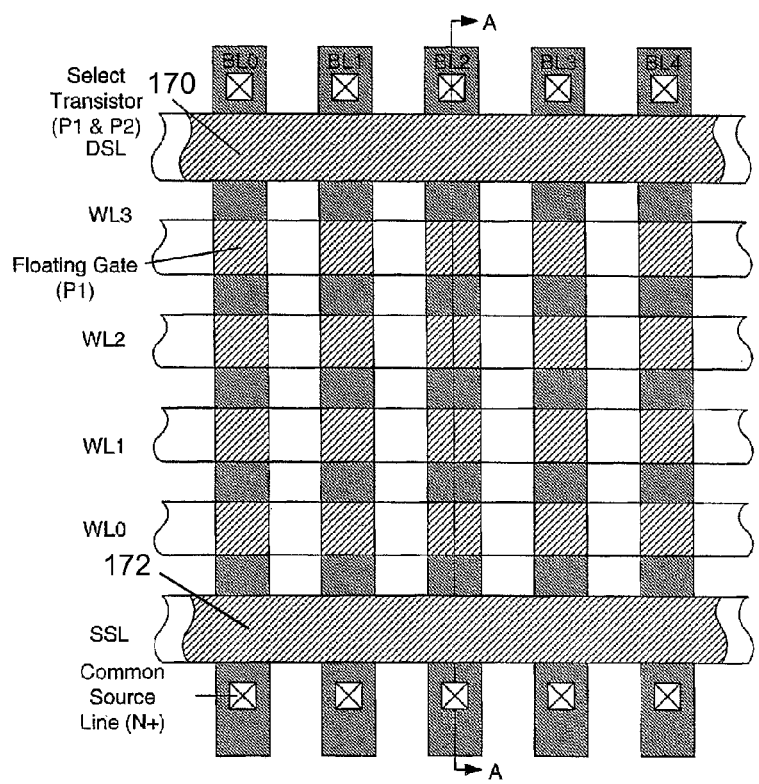
FIG. 3 is a plan view of a portion of a NAND flash memory array.
Figure 4:
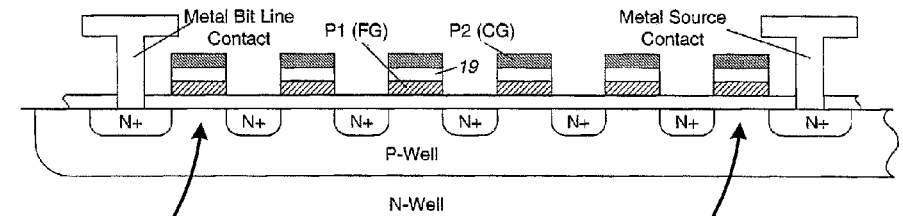
FIG. 4 is an orthogonal cross-sectional view taken along line A-A of the portion of the flash memory array depicted in FIG. 3.

A portion of a NAND memory array as can be fabricated in accordance with an embodiment of the present disclosure is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774, 397 and 6,046,935.

Figure 5:
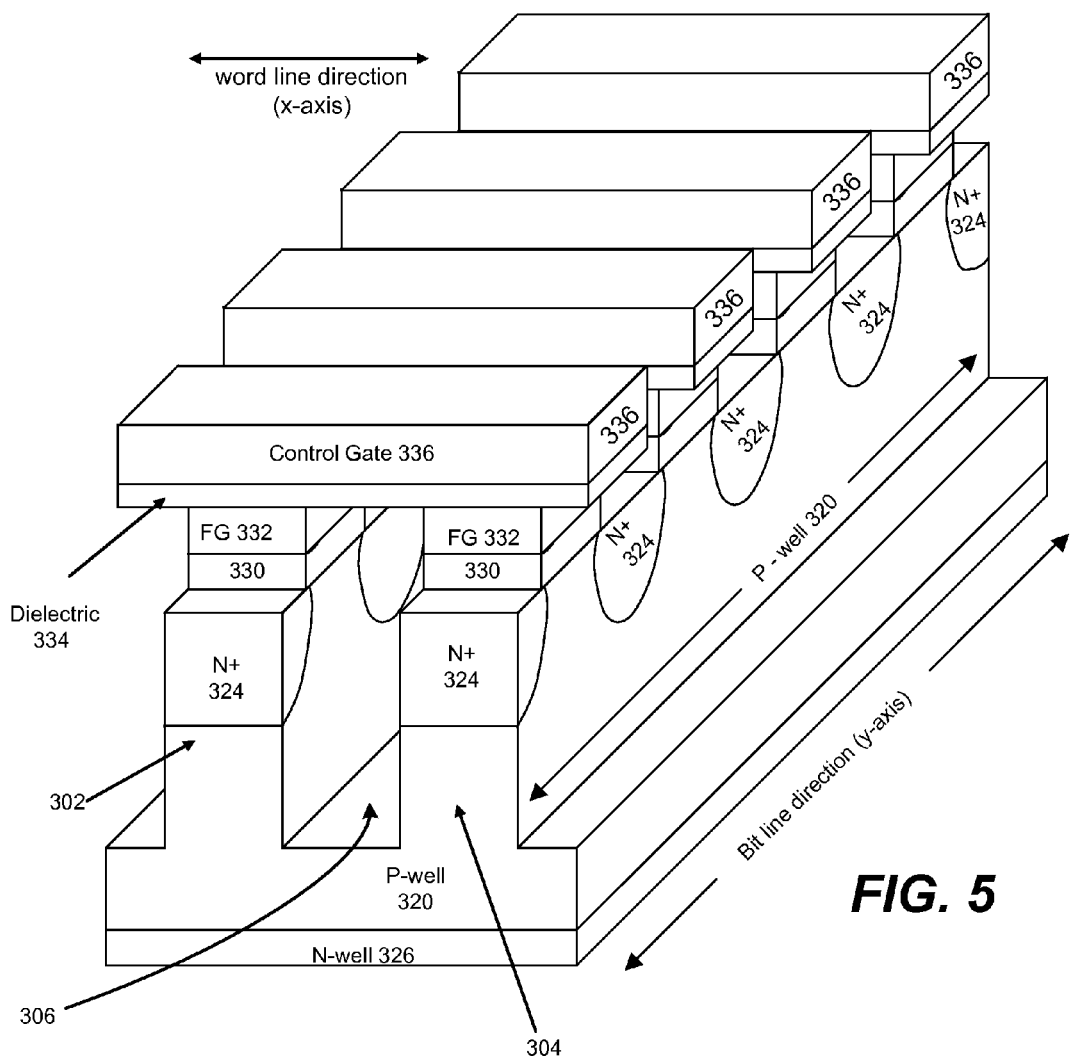
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 326 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306. Typically, an insulating material or dielectric is formed between adjacent NAND strings in this isolation area.

In accordance with embodiments of the present disclosure, air gaps are introduced in the column (bit line) and/or row (word line) direction to form isolation between closely spaced components in the memory structure. Air gaps can decrease parasitic interferences between neighboring charge storage regions (e.g., floating gates), neighboring control gates and/or between neighboring floating and control gates. Air gaps can include various material compositions and need not correspond to atmospheric air. For example, concentrations of elemental gases may vary in the air gap regions. An air gap is simply a void where no solid material is formed in the semiconductor structure.

High dielectric constant (K) materials are used (e.g., for the intermediate dielectric material) in one embodiment. High K materials can enhance coupling between the control gates and floating gates. A self-aligned high-K approach is utilized in one embodiment to reduce or eliminate charge transfer through the intermediate dielectric material. Incorporation of thin metal/charge-trap type floating gates are used in one embodiment to reduce or eliminate concerns with ballistic charge programming issues that may exist with conventional polysilicon floating gates.

FIG. 6 is a flowchart describing a method of fabricating non-volatile storage with air gap isolation in accordance with one embodiment. FIGS. 7A-7J are orthogonal cross-sectional views of one example of a non-volatile memory array that can be fabricated according to the method in FIG. 6. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 502, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

Figure 7A:
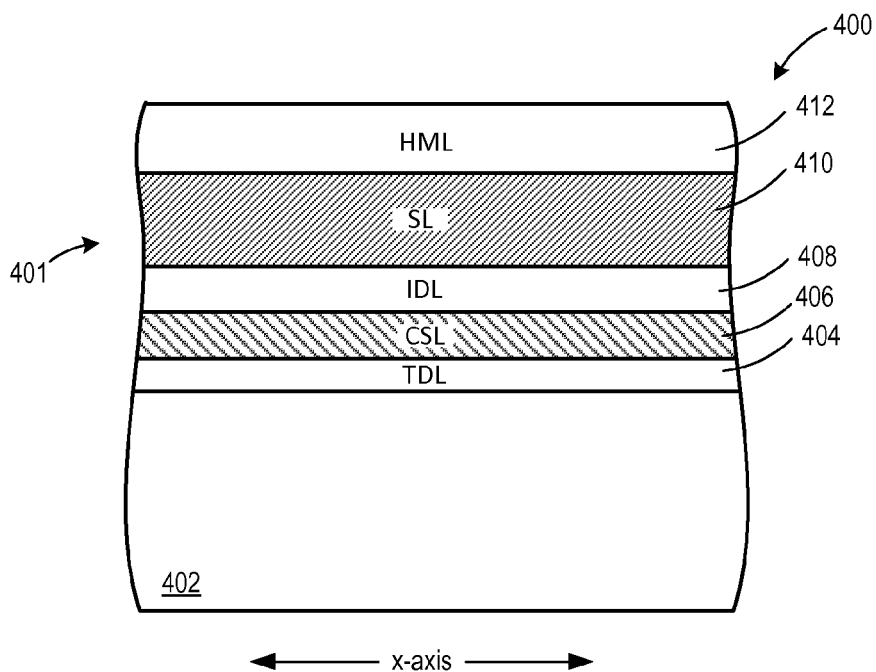
FIGS. 7A-7J are orthogonal cross-sectional views through a portion of a non-volatile memory array that may be fabricated according to the method of FIG. 6 in one example.

At step 504, an initial layer stack is formed over the substrate surface. FIG. 7A is a cross-sectional view along the x-axis in the row or word line direction of a memory array 400 showing a layer stack 401 formed over the surface of a substrate 402. In this example, layer stack 401 includes a tunnel dielectric layer (TDL) 404, a charge storage layer (CSL) 406, an intermediate dielectric layer (IDL) 408, a sacrificial layer (SL) 410 and one or more hard masking layer(s) (HML) 412. It is noted that a layer may be said to be over another layer when one or more layers are between the two layers as well as when the two layers are in direct contact.

The tunnel dielectric layer 404 is a thin layer of oxide (e.g., $SiO_2$) grown in one embodiment, although different materials and processes can be used. Chemical vapor deposition (CVD) processes, metal organic CVD processes, physical vapor deposition (PVD) processes, atomic layer deposition (ALD) processes, thermal oxidation or other suitable techniques can be used. In one example, the tunnel oxide layer is formed to a thickness of about 8 nanometers (nm). Although not shown, one or more high voltage gate dielectric regions may be formed at a peripheral circuitry region before or after forming the tunnel dielectric layer. The high voltage gate dielectric regions may be formed with a larger thickness (e.g., 30-40 nm) than the tunnel dielectric layer.

The charge storage layer is a polysilicon floating gate layer in one embodiment. The vertical dimension (with respect to the substrate surface) or thickness of the charge storage layer can vary by embodiment. In one example, the charge storage layer has a vertical dimension of 30 nm. In another example, the charge storage layer has a vertical dimension of 70-80 nm.

Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 10 nm and 20 nm. In another embodiment, metal thicknesses greater than 20 nm or less than 10 nm are used. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used.

The intermediate dielectric layer 408 is a triple layer of oxide, nitride and oxide (ONO) in one embodiment. In one embodiment, a high-K (dielectric constant) material is used for the intermediate dielectric to reduce or eliminate charge transfer through the intermediate layer while providing enhanced control gate to floating gate coupling. The sacrificial layer 410 is a layer of nitride in one embodiment although other materials can be used. The hard masking layer(s) 412 is an oxide or combination of oxide and nitride in one embodiment although other materials can be used.

The layer stack is patterned at step 506. The first pattern applied at step 506 corresponds to intended columns of the memory array and may be repetitive in the row or direction of the x-axis. The pattern also corresponds to intended active areas of the substrate which will be separated by isolation regions. In one embodiment, conventional photolithography using photoresist is used to pattern the hard mask layer 412 into strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced features sizes. The pattern, repetitive in the second or row direction, may define a first direction of etching to form columns of the targeted memory array.

After forming the pattern, the layer stack is etched at step 508 and the substrate is etched at step 510. The layer stack and substrate are both etched using the first pattern formed in step 506. The layer stack is etched into layer stack columns. The substrate is etched into active areas which underlie the columns and isolation regions which separate the active areas. The term layer stack is used to refer to the layers formed over the substrate throughout processing. Thus, layer stack 401 may refer to the collection of layer stack columns that result from etching the initial layer stack.

Figure 7B:
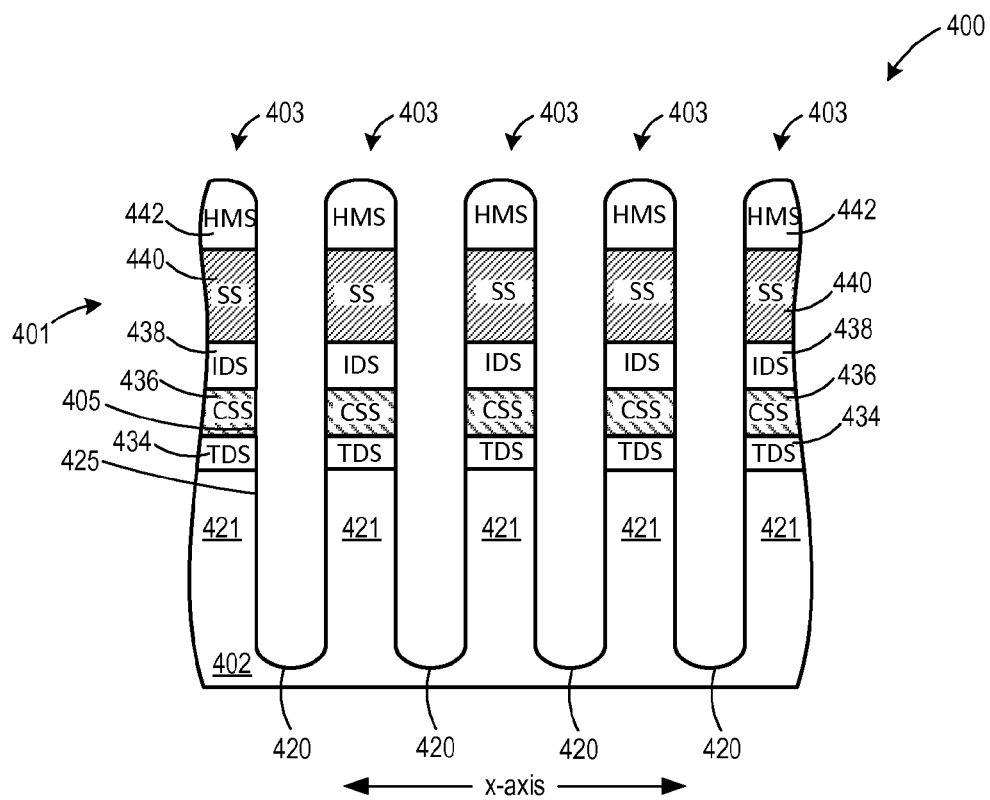

FIG. 7B depicts the memory array after etching in one example. Etching forms layer stack columns 403 that are elongated in the direction of the y-axis with spaces therebetween in the direction of the x-axis. Each layer stack column 403 includes a tunnel dielectric strip (TDS) 434, a charge storage strip (CSS) 436, an intermediate dielectric strip (IDS) 438, a sacrificial strip (SS) 440 and a hard masking strip (HMS) 442. Etching continues into substrate 402 to form isolation trenches 420 which are separated by active areas 421. In one example, the depth of the isolation regions in the substrate is 200 nm Various depths can be used, for example, ranging from 180-220 nm in one embodiment. In one embodiment, reactive ion etching is used with various combinational etch chemistries to etch the different layers. Any suitable etch process(es) can be used.

At step 512, a dielectric liner is formed along the exposed surfaces of the isolation regions in the substrate and along the exposed surfaces of the layer stack columns. The liner coats the vertical sidewalls of the layer stack columns as well as the walls of the isolation regions wall. At step 514, the isolation regions are filled with a dielectric fill material. The fill material is formed in the isolation regions as well as the spaces between adjacent layer stack columns. In one example, the dielectric liner is formed from a first dielectric material and a second, different dielectric material is used to fill the isolation regions. The second material may be formed with an etch selectivity that permits etching the second dielectric material without etching the first dielectric material.

Figure 7C:
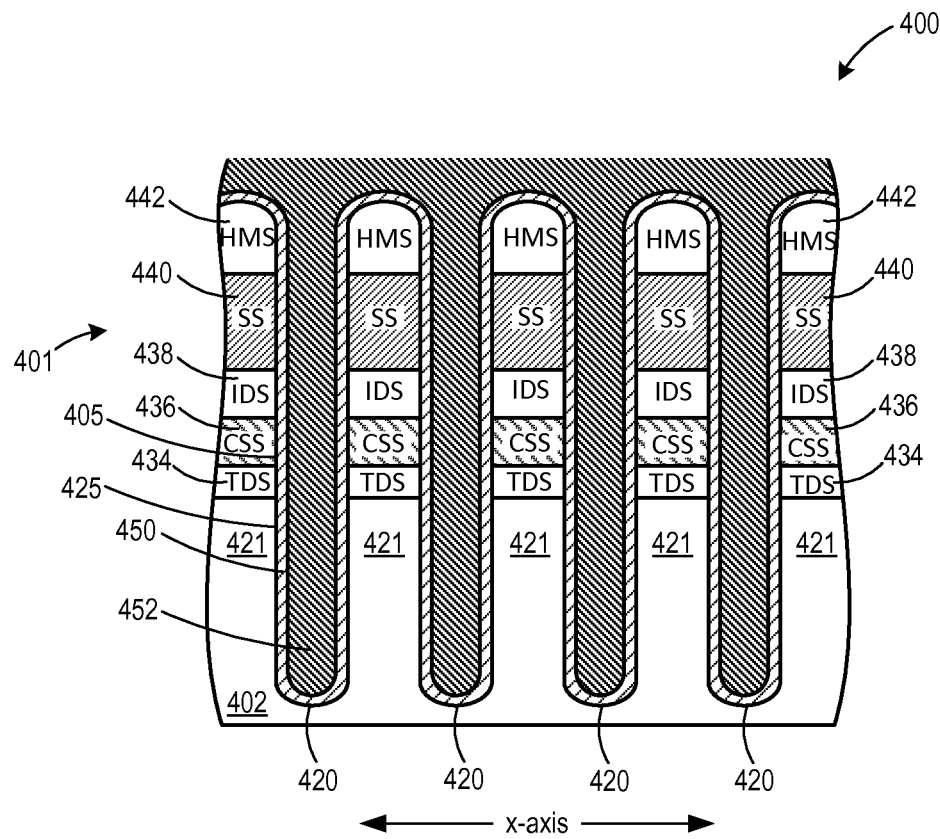

FIG. 7C depicts the memory array after forming a dielectric liner and dielectric fill material in one example. A thin dielectric liner 450 is formed in the isolation regions. In one embodiment, the liner is a high-temperature oxide (HTO) formed using a deposition process. Different thicknesses of the liner may be used. In one example, the liner has a thickness of 4 nm or less. In other examples, larger thicknesses may be used. Liner 450 is formed along the vertical sidewalls 405 of the layer stack columns 403 and the vertical sidewalls 425 of the isolation regions 420.

A dielectric fill material 452 is then formed to fill the trench. In one embodiment, material 452 is a spin on dielectric (SOD) having a high etch selectivity with respect to the liner 450. An oxide is used for material 452 in one example although other materials can be used. A high etch selectivity of material 452 to material 450 can be achieved by skipping anneals. By not annealing fill material 452, or by not annealing fill material 452 to the same degree as liner 450, a high etch selectivity between layer 452 and liner 450 may be obtained. Layer stack 401 now includes portions of the fill material extending above the substrate surface.

Figure 7D:
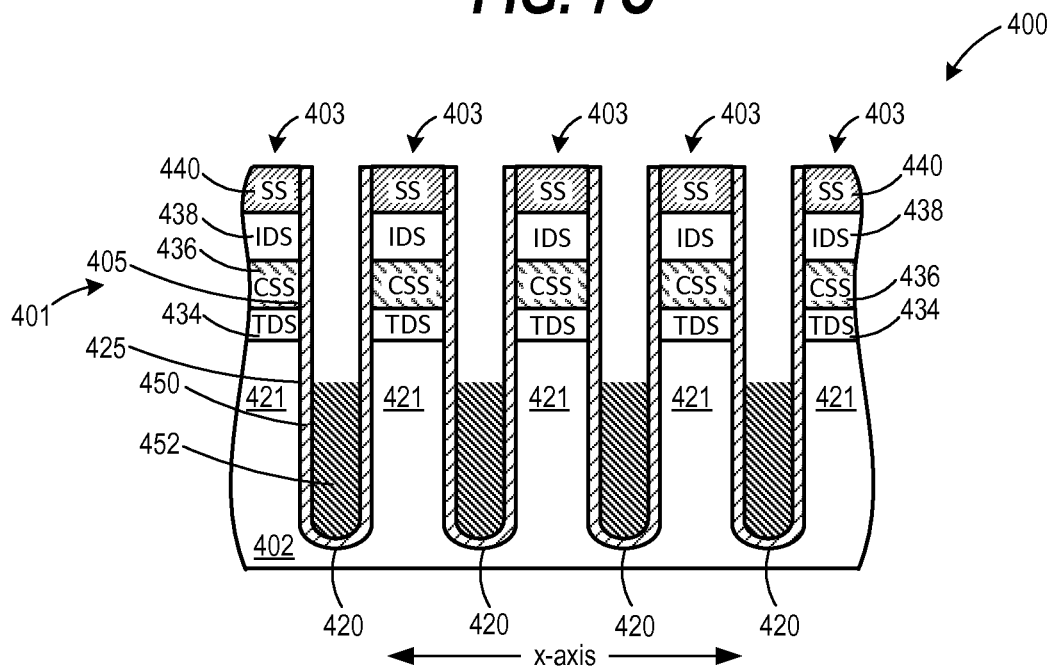

At step 516, the second dielectric material is etched back to a depth less than the depth of the isolation regions. The results of step 516 in one example are depicted in FIG. 7D. Chemical mechanical polishing is first used to planarize the layer stack surface. Any overfill of material 452 is removed, along with hard masking strips 442. Some of sacrificial material 440 may be removed as well. After polishing, an etch process is applied to recess dielectric material 452 to a depth less than the depth of the trenches. The upper surface of the fill material 452 is recessed to a depth below the surface of substrate 402. In one embodiment, the distance between the upper surface of the fill material 452 and the substrate surface is 100 nm. Various distances may be used. For example, a range of 100-150 nm can be used in one embodiment. As earlier described, material 452 may be subjected to less annealing than material 450 to achieve a suitable etch selectivity with respect to liner 450. In this manner, material 452 is recessed, while leaving liner 450 along the vertical sidewalls 405 of layer stack columns 403 and the vertical sidewalls 425 of isolation regions 420. Liner 450 thus remains available to protect the sidewalls of strips 434, 436, 438 including the tunnel dielectric, charge storage and intermediate dielectric layers during subsequent processing steps.

At step 518, air gaps are formed in the isolation regions 420 and/or the spaces between adjacent layer stack columns 403. The air gaps are elongated in the y-direction. They extend in the y-direction to provide electrical isolation between elements of adjacent layer stack columns 403 and/or adjacent active areas 421 of the substrate. The vertical dimension (with respect to substrate surface) and row dimension (along x-axis) of the air gaps can vary to meet the particular requirements (e.g., suitable isolation parameters) of a given implementation. The air gaps may be formed: in a portion of the isolation regions and a portion of the spaces between adjacent layer stack columns; only in the isolation regions; or only in the spaces between the adjacent layer stack columns.

Figure 7E:
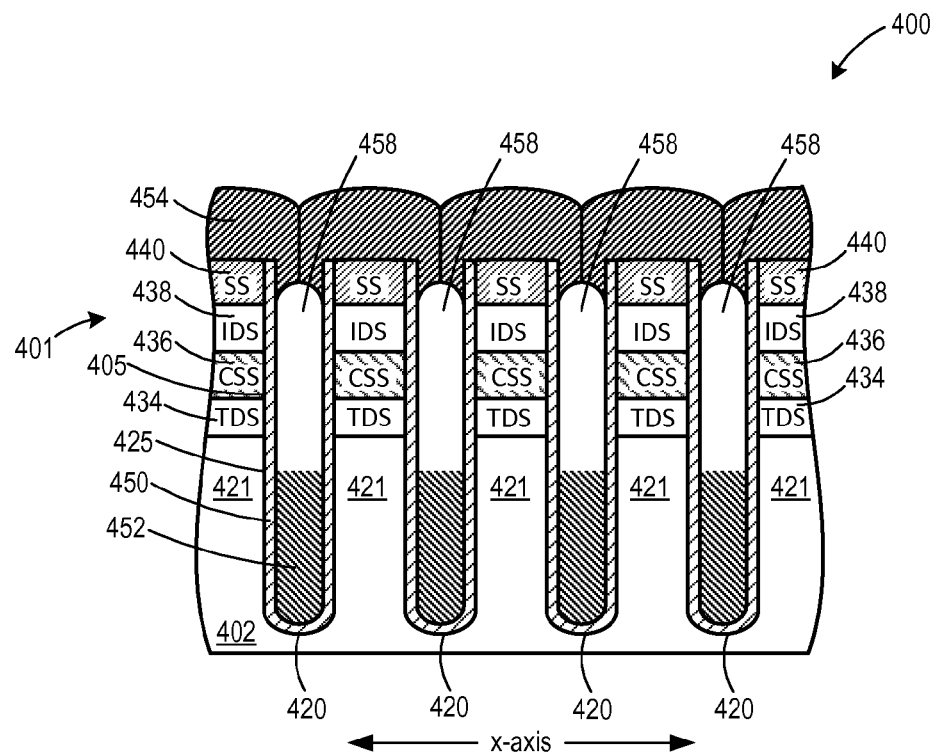

In FIG. 7E, an example is depicted where a capping layer 454 is formed over the layer stack columns using a non-conformal deposition process. By using a non-conformal deposition process, material 454 will be deposited unequally at the upper portion of the layer stack columns. Material 454 quickly accumulates, meeting at a location over the isolation regions, forming air gaps 458. Material 454 extends vertically toward the substrate surface along the liner 450 on a portion of vertical sidewalls 405. In this example, material 454 extends along liner 450 to about the level of the upper surface of the intermediate dielectric strips 438. Because material 454 accumulates faster along liner 450, the upper endpoint of air gap 458 extends above the level of the upper surface of the intermediate dielectric strips 438.

In one embodiment, layer 454 is an oxide but other materials such as nitrides may used in other implementations. Although not shown, some portion of dielectric 454 may enter the isolation region and form over fill material 452. This portion of the dielectric 454 may raise the lower endpoint of the air gap in the isolation regions a small amount. However, a very non-conformal oxide will quickly grow together to seal off the regions as shown without a substantial decrease in the vertical dimension of the air gap. Although referred to as "air" gaps, the elemental composition of the air can include many different materials. Thus, the term "air" should not be construed as having any particular elemental composition. The air gaps are voids, where no solid material is formed. Any number and type of gases may be in the gaps 458.

Figure 7F:
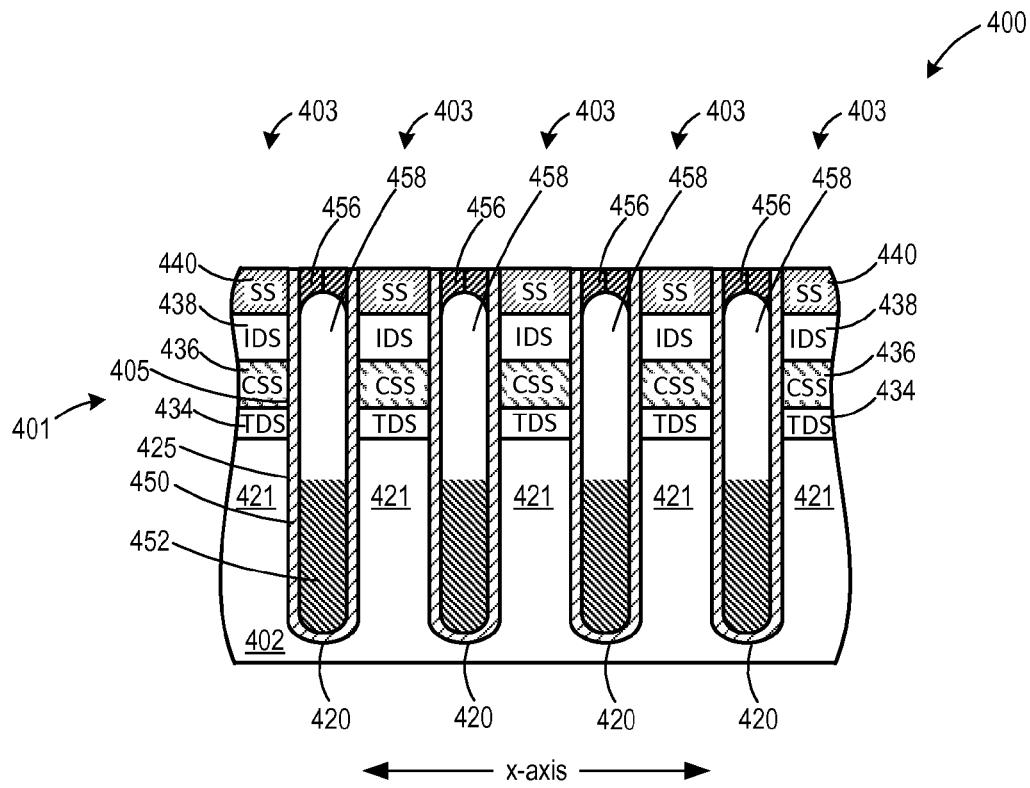

FIG. 7F shows the device after polishing (e.g., CMP) to planarize the upper surface of the layer stack. The non-conformal oxide 454 is polished to at least the upper surface of strips 440 in this example, forming oxide plugs or caps 456. Caps 456 overlie the isolation regions. In one embodiment some of oxide 454 may remain above strips 440 after polishing.

At step 520, a control gate layer is formed over the layer stack upper surface after removing any remaining portions of the sacrificial strips. In one embodiment, the control gate layer is polysilicon. The polysilicon can be doped in-situ or after formation. In another embodiment, the control gate layer is formed at least partially of a metal. In one example, the control gate layer has a lower portion that is formed from polysilicon and an upper portion that is formed from metal. A barrier layer may be formed between the polysilicon and the metal, to prevent silicidation. In one embodiment, the control gate is entirely metal. Metals in various embodiments may include tungsten, although other metals may be used. The control gate layer may be formed by chemical vapor deposition (CVD), atomic layer deposition (ALD), plating, or another technique.

Figure 7G:
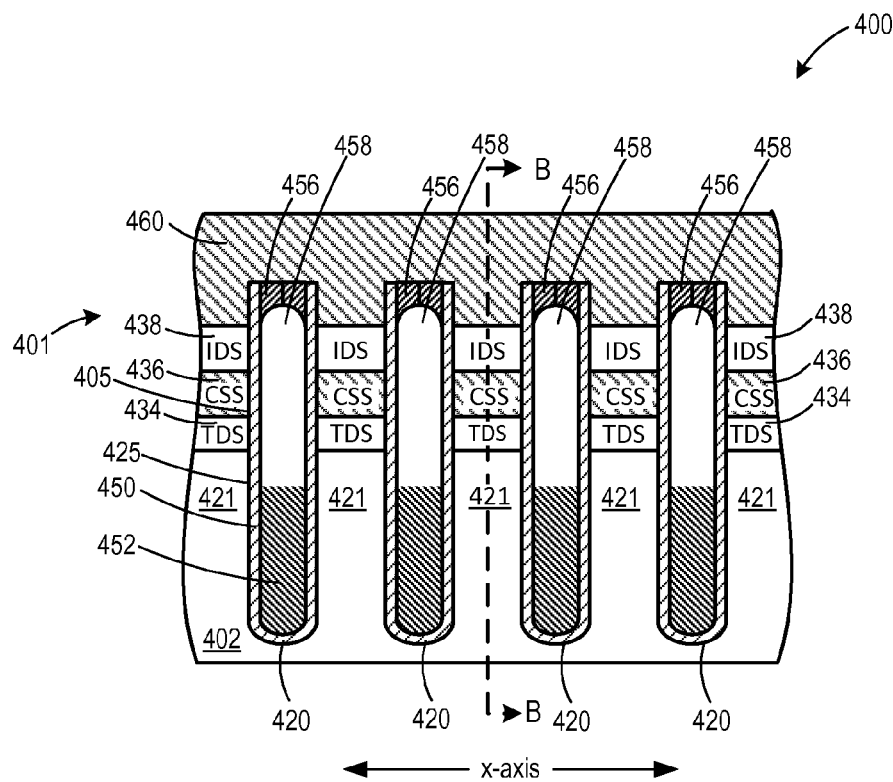

FIG. 7G depicts the device after first stripping the remaining portions of the sacrificial strips 440 and then forming a control gate layer 460. Any suitable etch process can be used to remove the sacrificial material. The control gate layer can be polished after formation in one embodiment.

At step 522, a second pattern is applied over the layer stack. The second pattern is formed for etching orthogonal to the direction of etching using the first pattern. The second pattern may include strips of hard masking material and/or photoresist, or other suitable mask, that are elongated in the row direction along the x-axis with a spacing between strips in the column direction along the y-axis. The pattern defines the gate length for the charge storage region of each memory cell.

Figure 7H:
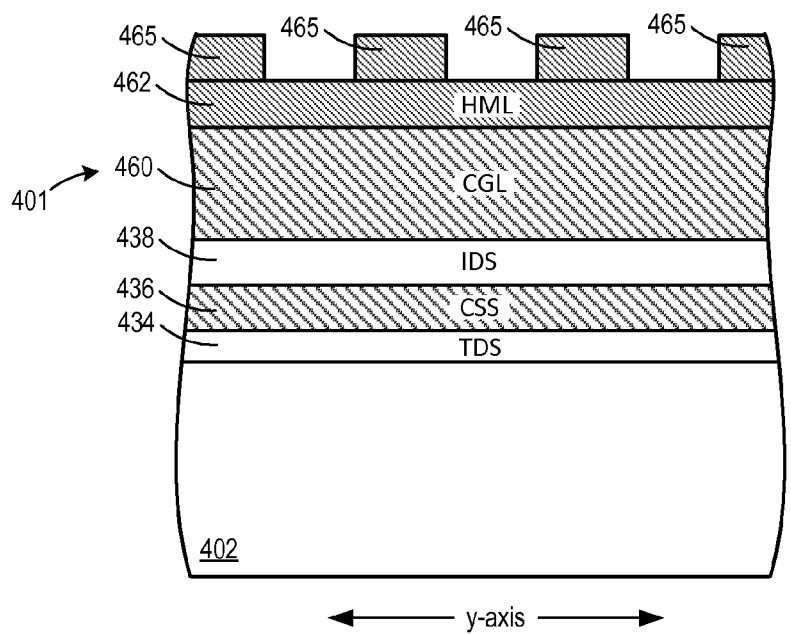

FIG. 7H is a cross-sectional view taken along line B-B of FIG. 7G, depicting the device in cross-section in the direction of the y-axis or bit line direction. FIG. 7H depicts the results of step 522 after forming the second pattern. Over the control gate layer is formed one or more hard masking layers 462. Strips 465 of photoresist or another patterning agent are applied.

At step 524, the layer stack is etched into layer stack rows. In one embodiment, etching the layer stack includes etching strips 434 of the tunnel dielectric material. In another embodiment, the tunnel dielectric is not etched. Reactive ion or another suitable etch process may be used. One or more etch chemistries may be applied to etch through the various layers of the stack.

Figure 7I:
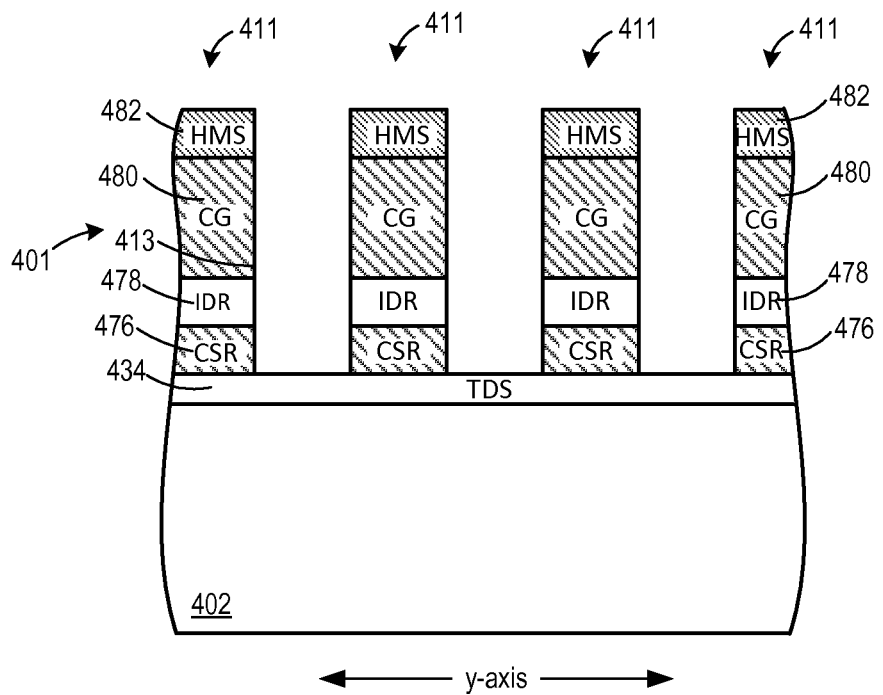

FIG. 7I depicts the results of step 524. Etching continues until reaching the tunnel dielectric layer in this example. In other examples, etching may continue until reaching the substrate surface. In another example, some portion of the tunnel dielectric layer is etched without completely etching through the layer. Etching forms layer stack rows 411. The hard masking material is etched into hard mask strips (HMS) 482 and the control gate layer is etched into control gates (CG) 480. In one embodiment, the control gates 480 form word lines. The intermediate dielectric strips 438 are etched into intermediate dielectric regions (IDR) 478. The charge storage strips 436 are etched into individual charge storage regions (CSR) or floating gates 476. After etching the layer stack, into rows an implant process can be performed to create n+ source/drain regions. In one embodiment, the n+ source/drain regions are created by implanting n-type dopants such as arsenic or phosphorus into the p-well.

At step 526, air gaps are formed at least partially in the spaces between the layer stack rows The air gaps are elongated in the x-direction. They extend in the x-direction to provide electrical isolation or shielding between elements of adjacent layer stack rows. The vertical dimension and column dimension (along y-axis) of the air gaps can vary to meet the particular requirements of a given implementation.

Figure 7J:
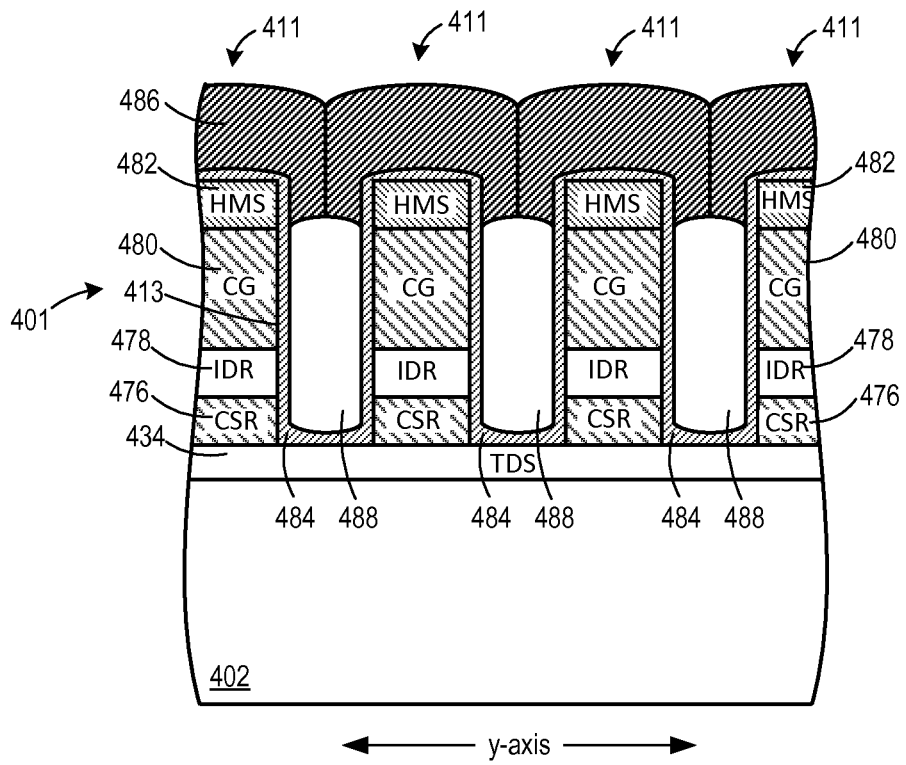

FIG. 7J depicts the results of step 526 in an example where a capping layer 486, similar to that used in forming the bit line air gaps 458, is formed over the layer stack rows using a non-conformal deposition process. A dielectric liner 484 (e.g., oxide) is formed along the sidewalls 413 of the layer stack rows, over the upper surface over hard mask strips 482, and over the exposed upper surface of the tunnel dielectric strips 434. The dielectric liner will also be formed along the sidewalls (not shown) of the rows (extending in the y-direction) that are exposed along the bit line air gaps 458. Capping layer 486 accumulates by using a non-conformal deposition process and meets at a location over the spaces between rows to form air gaps 488 that are elongated in the x-direction. Material 454 extends vertically toward the substrate surface along the liner 484 on a portion of vertical sidewalls 413 of the layer stack rows. The amount of this vertical dimension will define an upper endpoint of the air gaps at a lower surface of material 486. In this example, it is seen that the air gap extends vertically beyond the level of the upper surface of control gate strips 480. Although not shown, some portion of dielectric 486 may enter the spaces between rows. This portion of the dielectric 454 may raise the lower endpoint of the air gap. Any accumulation will be minor and only decrease the size of the air gap minimally. Although not shown, a polishing step can be applied to form individual caps from layer 486 as earlier described with respect to layer 454. The capping layer 486 can be polished to form plugs sealing the word line air gaps 488. A planar surface can be created for further processing steps.

At step 528, front end processing is completed. In one example, step 528 may include interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed. Various backend processes can be performed to finalize fabrication of the array. For example, a passivation dielectric layer can be deposited, followed by forming metal conductive lines and vias to connect the lines with source and drain regions at the end of the memory cell strings, etc.

In the embodiment described in FIGS. 6 and 7A-7J, bit line air gaps are formed using an etch back process for a dielectric fill material 452 that is formed in the isolation trenches. The fill material is etched back before patterning and etching the control gate and charge storage layer to form word lines and charge storage regions.

FIGS. 8 and 9A-9I describe another embodiment where a sacrificial fill material is formed in the isolation regions and spaces between layer stack columns. This material remains in the memory array until after the control gate layer is etched into word lines and the charge storage layer strips are etched into individual charge storage regions. The described embodiment is exemplary only and its precise form should not be taken as limiting the disclosure.

Figure 8:
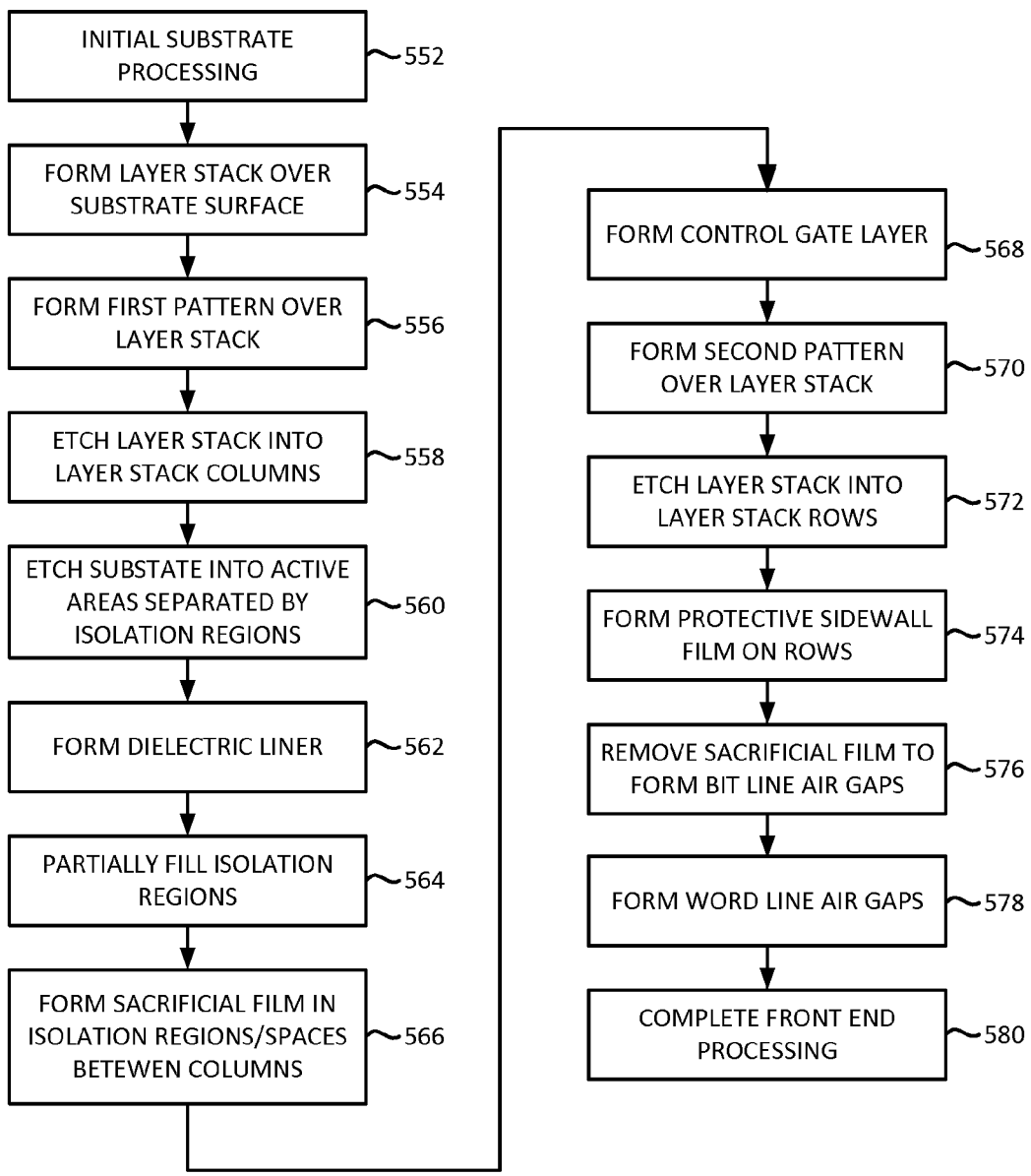
FIG. 8 is a flowchart describing a method of forming bit line and word line air gaps in accordance with one embodiment of the disclosure.
Figure 9A:
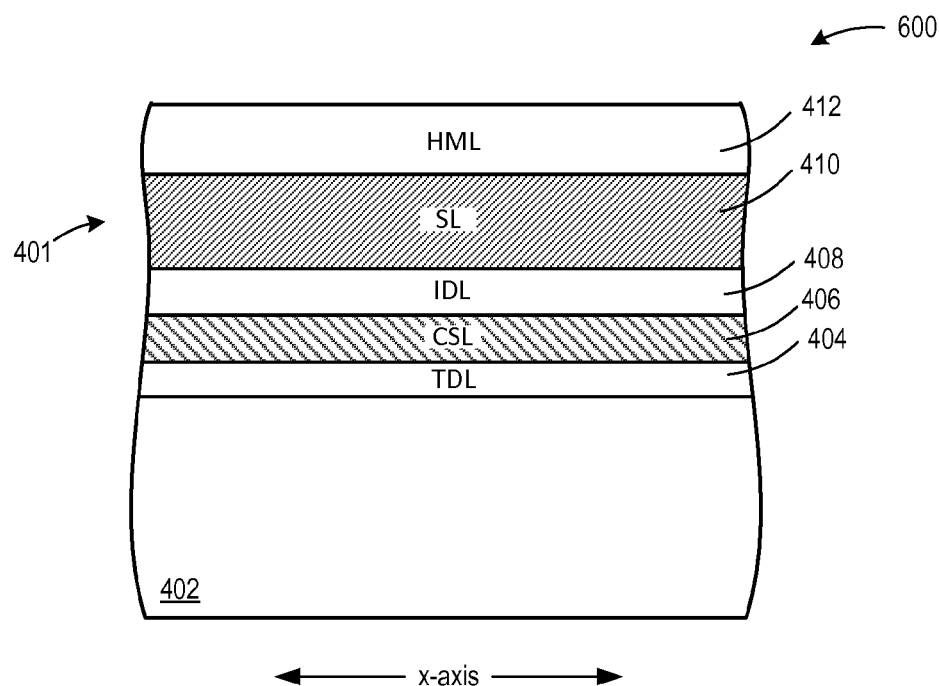
FIGS. 9A-9I are orthogonal cross-sectional views and perspective views of a portion of a non-volatile memory array that may be fabricated according to the method of FIG. 8 in one example.

At steps 552-554 of FIG. 8, a substrate is processed, followed by forming a layer stack. FIG. 9A is a cross-sectional view taken along the x-axis through a memory array undergoing fabrication that depicts the results of steps 552-554 in one example. A tunnel dielectric layer 404, charge storage layer 406, intermediate dielectric layer 408, sacrificial layer 410 and one or more hard masking layers 412 make up layer stack 401 as described above.

Figure 9B:
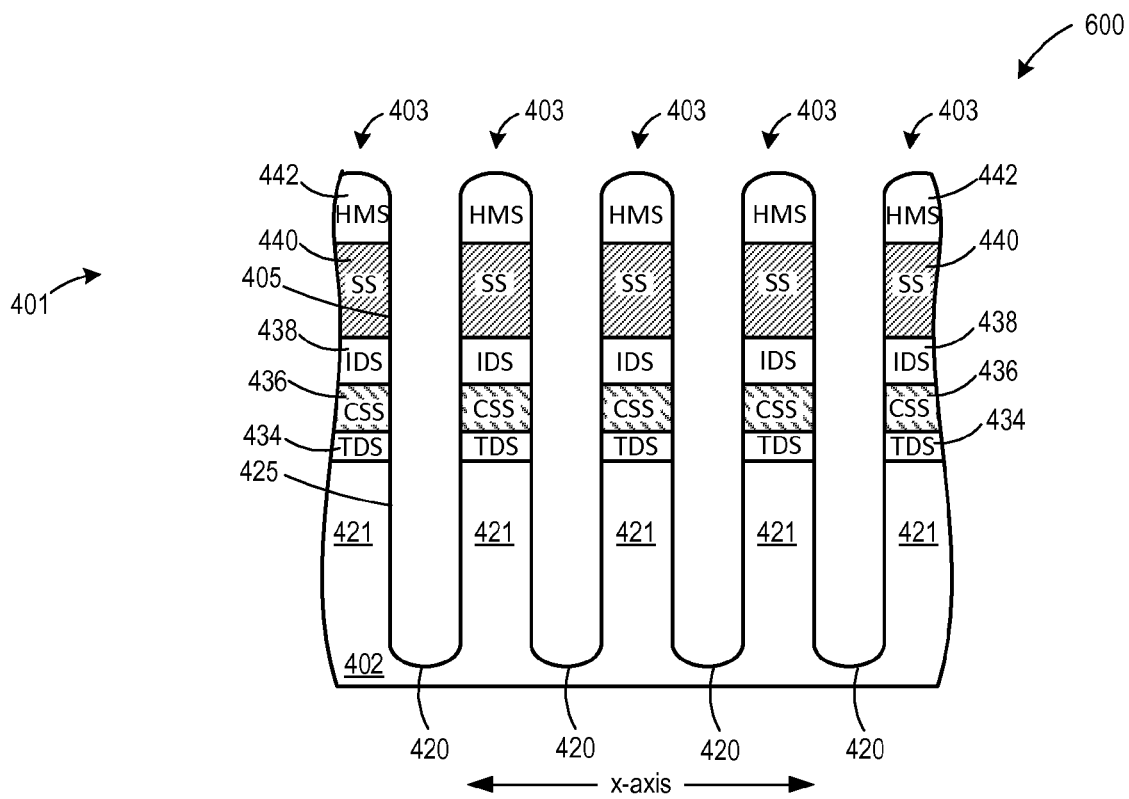

The layer stack is then patterned at step 556 and etched at step 558. Etching continues into the substrate to define active areas and isolation regions at step 560. FIG. 9B depicts the results of steps 556-560, forming layer stack rows 403 as described above.

At step 562, a dielectric liner is formed along the vertical sidewalls of the isolation regions and layer stack columns as also described above. At step 564, the isolation regions are partially filled with a dielectric material. This partial dielectric fill is formed to a depth less than that of the isolation regions. The distance between the upper surface of the fill and the surface of the substrate will define a vertical dimension of part of the ensuing air gap. Different materials are used for the dielectric liner in one embodiment. For example, the liner may be a high temperate oxide (HTO) and the partial fill material a standard oxide. In one embodiment, the partial fill material is an oxide formed using a deposition process, but other materials and processes can be used.

At step 566, a sacrificial film is formed in the remaining portions of the isolation regions and also the spaces between layer stack columns. In one embodiment, the sacrificial film is a spin-on dielectric (SOD). In one example, the sacrificial film is a borosilicate glass (BSG) or other type of oxide. In another example, a spin-on-carbon can be used. Other materials can also be used such as polysilicon, silicon nitride (SiN) or an undensified polysilazane (PSZ) such as a PSZ-based inorganic spin-on-glass (SOG) material. The sacrificial film can be chosen for a high etch selectivity with respect to the liner so that it etches at a faster rate than the liner. In one example, the etch selectivity of the sacrificial film is achieved by skipping anneals.

Figure 9C:
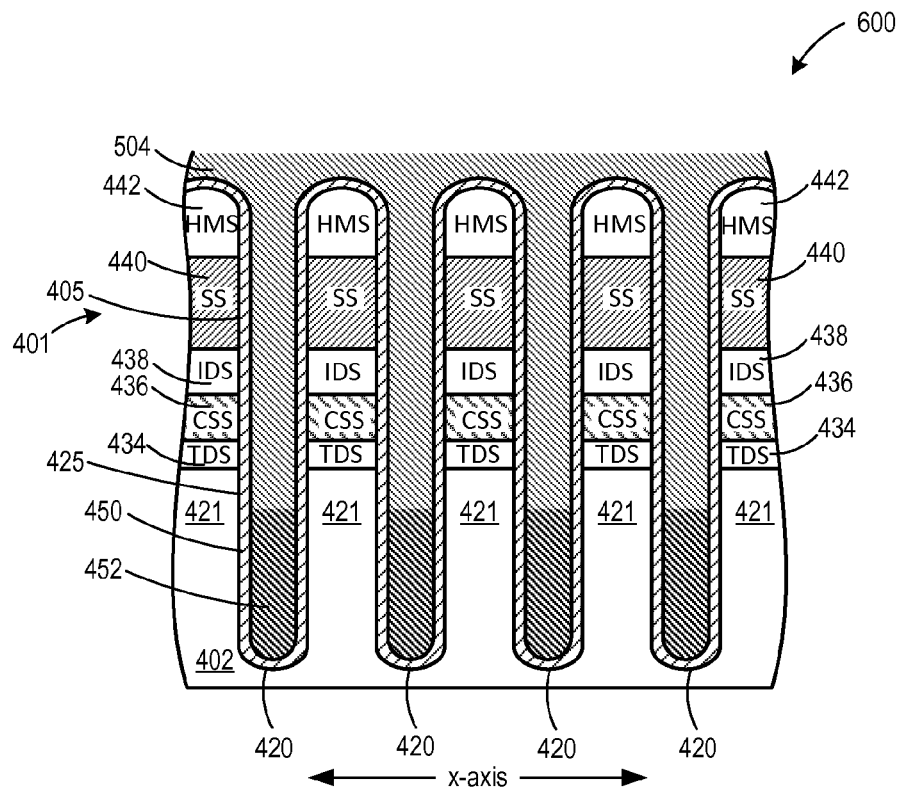

FIG. 9C depicts the results of step 566 in one embodiment. The dielectric liner 450 is formed along vertical sidewalls 425 of the isolation regions and vertical sidewalls 405 of the layer stack columns. The dielectric fill material 452 is formed, partially filling each isolation region 420. In one example, the distance between the upper surface of the partial fill material and the upper surface of the substrate is about 100 nm. Various distances may be used. For example, a range of 50-100 nm can be used in one embodiment. Lastly, a sacrificial film 504 is formed to complete filling of isolation regions 420 and also to occupy the space between adjacent layer stack columns.

Figure 9D:
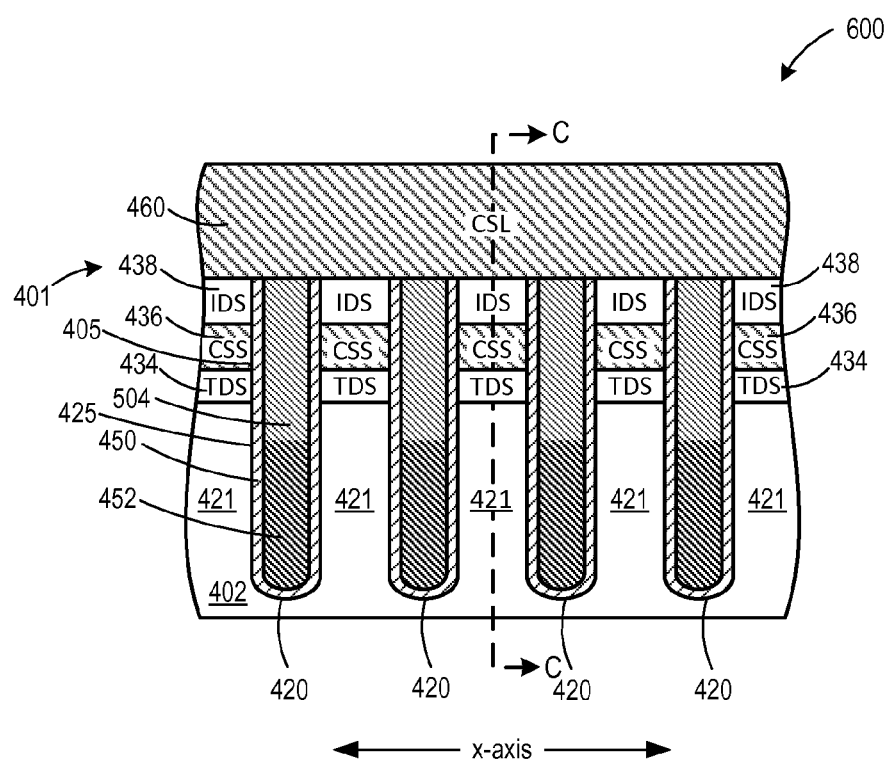

A control gate layer is then formed over the layer stack at step 568. FIG. 9D depicts the results of step 568 in one example. After filling with the sacrificial material 504, the layer stack columns are polished until reaching the sacrificial strips 440. The sacrificial fill material 504 is then etched back, followed by stripping any remaining portions of the sacrificial strips 440. This results in a relatively planar surface formed by the upper surface of intermediate dielectric strips 438, liner 450 and sacrificial film 504. Control gate layer 460 is then formed as earlier described.

Figure 9E:
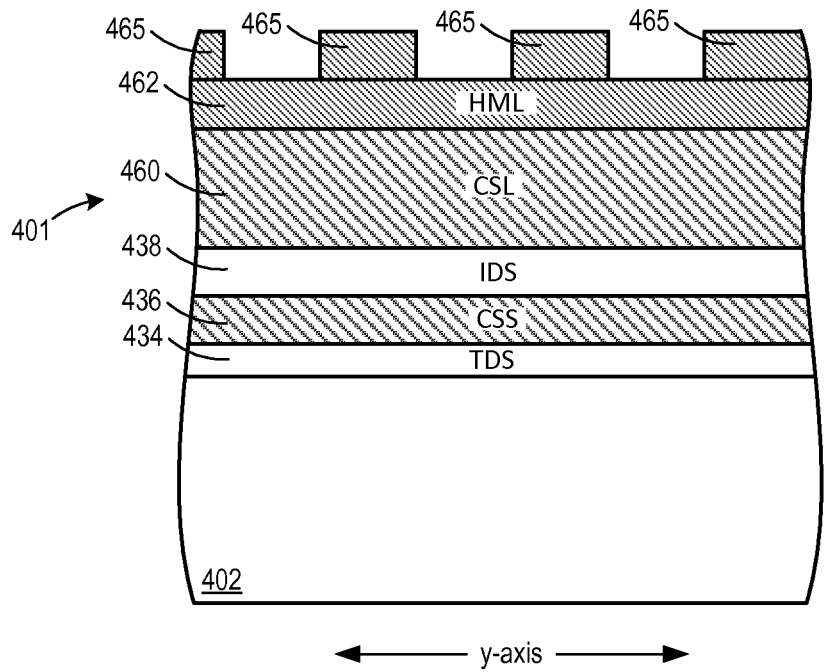

After forming one or more hard masking layers, a second pattern is formed over the layer stack at step 570. FIG. 9E is a cross-sectional view taken along line C-C in FIG. 9D, depicting hard masking layer 462 and strips 465 of photoresist forming the second pattern. This second pattern is formed with strips 465 that extend in a direction (row direction) that is orthogonal to the direction (column direction) of the first pattern applied at step 556.

Figure 9F:
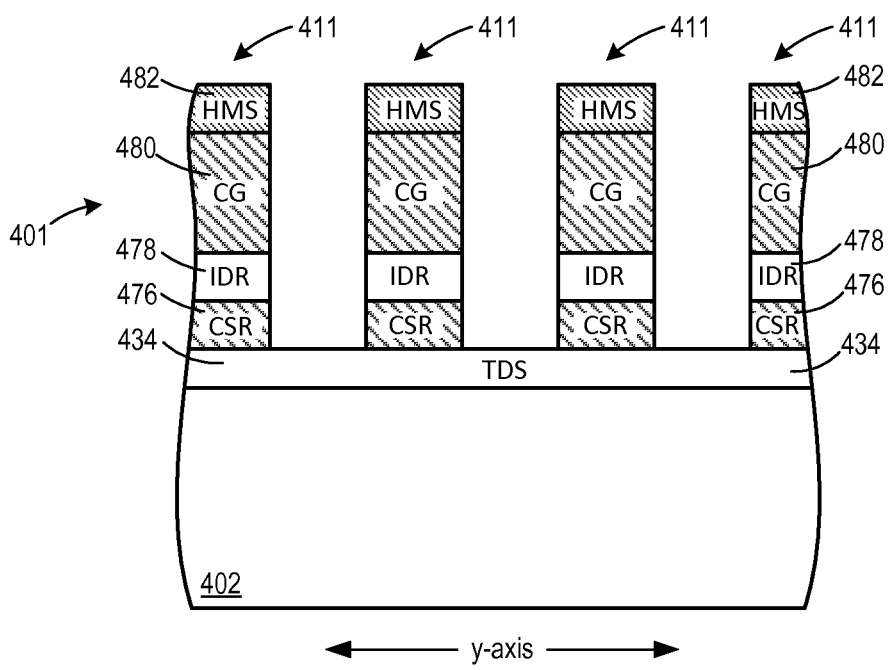
Figure 9G:
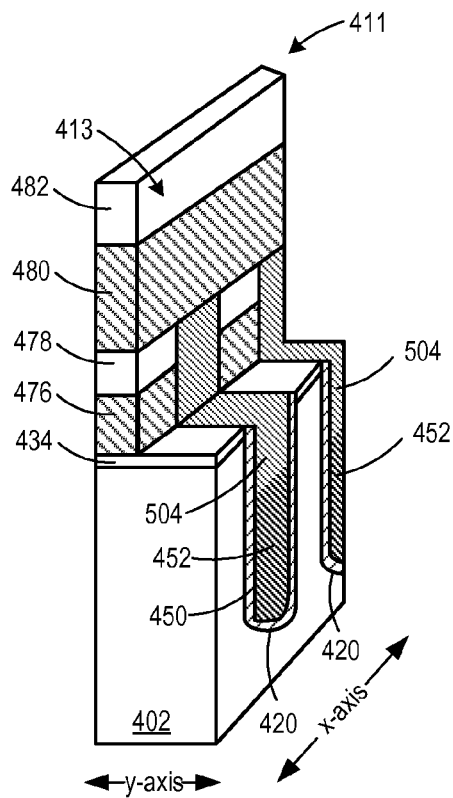

At step 572, the layer stack 401 is etched into layer stack rows 411. FIG. 9F depicts the results of step 572 in one example. In this example, tunnel dielectric layer 434 is not etched, remaining continuous in the bit line direction. Each layer stack row 411 includes a control gate 480 formed from control gate layer 460, an intermediate dielectric region 478 and a charge storage region 476. FIG. 9G is a perspective view of the device depicting the point in processing shown in the cross-sectional view of FIG. 9F.

Figure 9H:
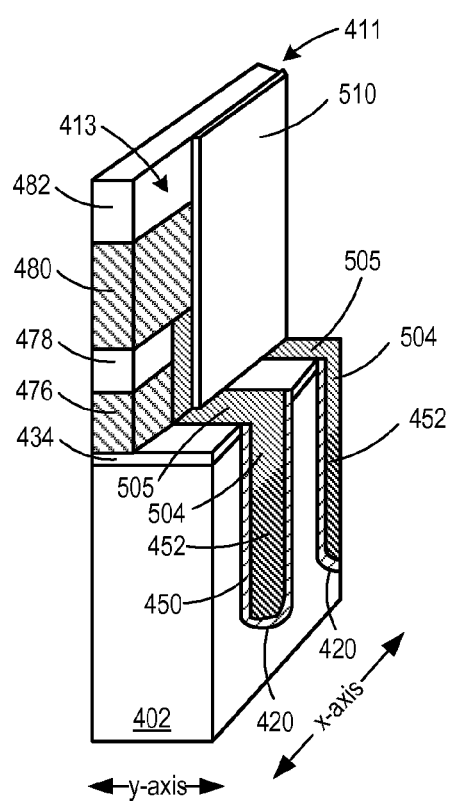

At step 574, a protective sidewall film is formed along the vertical sidewalls of the layer stack rows. Different films may be used in different implementations. In one example, an oxide can be deposited and etched back to form sidewall films along the sidewalls of the individual layer stack rows. Traditional spacer formation processes may be used. FIG. 9H depicts a protective sidewall spacer 510 that is formed along the sidewall 413 (extending in the word line direction) of one of the layer stack rows 411. The sidewall spacer 510 is depicted as only partially extending along the sidewall 413 in the x-axis direction for clarity. The spacer will actually extend fully along the length of each layer stack row. Each layer stack row will include two sidewall spacers 510, with one on each vertical sidewall 413.

The sidewall spacers 510 will protect each layer stack row during subsequent processing steps. In one embodiment, the spacer material is chosen for its etch selectivity with respect to the sacrificial film 504. In this manner, the sacrificial film can later be removed in processes where the layer stack sidewalls are not exposed to the various etch chemistries. This will protect the sidewalls of the control gate layer and charge storage layer as well as the various dielectric layers.

FIG. 9H illustrates that etching back the sidewall spacer material exposes the sacrificial material 504 in trenches 420. A portion of an upper surface 505 of the sacrificial material 504 corresponding to the spaces between adjacent layer stack rows is exposed. This allows subsequent processing to remove the sacrificial material in order to form an air gap in the bit line direction.

At step 576, the sacrificial material is removed from the isolation regions 420 and from between the layer stack columns 403. A wet etch process is used in one embodiment, although other suitable etch processes (e.g., dry) can be used. As earlier described, the etch process is selective for the sacrificial film so that it can be removed without removing the liner 450 in the isolation regions and the sidewalls spacers 510 on the layer stack rows.

Figure 9I:
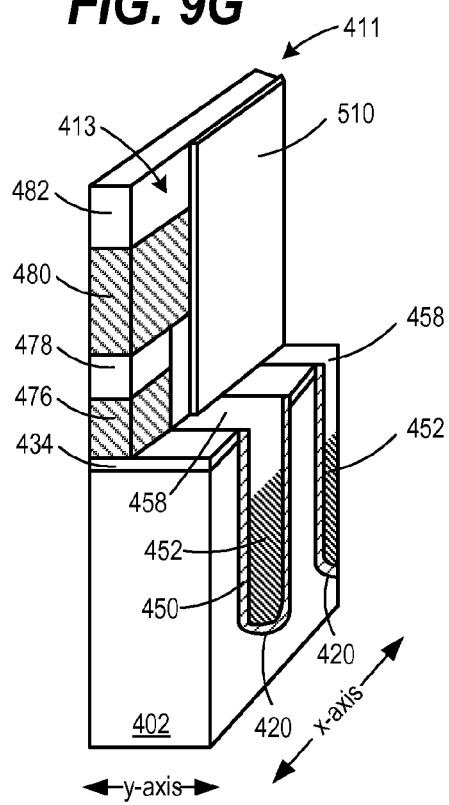

FIG. 9I depicts the array after removing sacrificial material 504 from isolation regions 420 and the areas between layer stack columns. Etching removes the film from the isolation regions, beginning with the material exposed by etching back spacers 510. Etching will also remove the sacrificial material in the isolation regions that underlies the layer stack rows. Etching will begin attacking the sacrificial material from the side under the rows after etching proceeds vertically down into the isolation regions. Etching will further continue behind the sidewall spacers 510 to remove portions of the sacrificial material that extend above the isolation regions and substrate surface. Etching removes the material between charge storage regions 476 and intermediate dielectric regions 478 that are adjacent in the word line or row direction. Some of the sacrificial material may not be removed. Thus, removing the sacrificial material does not necessarily have to include removing all of the material.

Removing the sacrificial material forms air gaps 458. The air gaps are elongated in the column direction in the isolation regions 420. The air gaps extend from below the surface of the substrate to the level of the upper surface of the intermediate dielectric regions. As earlier described, the air gaps may have different vertical dimensions in different embodiments. The air gaps may not extend as deep within isolation regions and may not extend as far above the substrate surface. Further, the air gaps may be formed exclusively within the isolation regions or exclusively between adjacent layer stack columns in other examples.

At step 578 word line air gaps are formed that extend in the row or word line direction between adjacent layer stack rows. In one embodiment, the word line air gaps are formed as described in FIGS. 6 and 7A-7J. In one example, a liner 484 as depicted in FIG. 7J may be omitted. Spacers 510 can protect the sidewalls of the layer stack rows such that an additional material can be omitted. In one example, a capping layer 486 is formed along the vertical sidewalls of spacers 510 to form word line air gaps 488. The capping layer may extend vertically toward the substrate surface to the level of the upper surface of the sacrificial strips 482 in one example, although other dimensions may be formed in other examples. At step 580, front end processing can be completed as described above.

FIGS. 10A-10J depict an embodiment similar to that of FIGS. 8 and 9A-9J that uses a sacrificial film to form bit line air gaps. In this example, however, the intermediate dielectric layer is continuous in the row direction. This permits the fabrication of so-called flat memory cells that have continuous control gates and intermediate dielectric layers in the row direction. The lower surfaces of these layers are flat such that these structures are often referred to as flat memory cells.

Figure 10A:
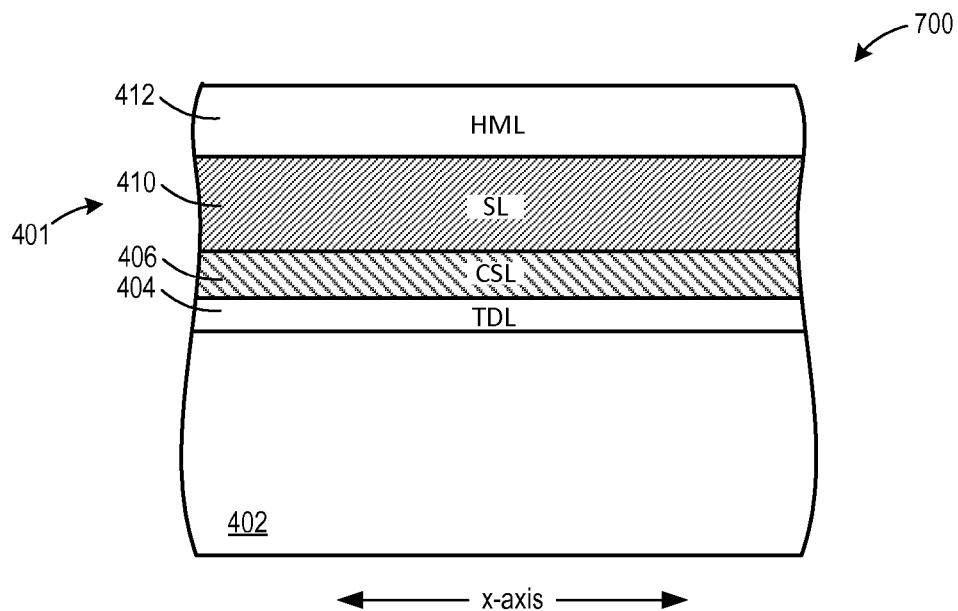
FIGS. 10A-10I are orthogonal cross-sectional views and perspective views of a portion of a non-volatile memory array in accordance with one embodiment.
Figure 10B:
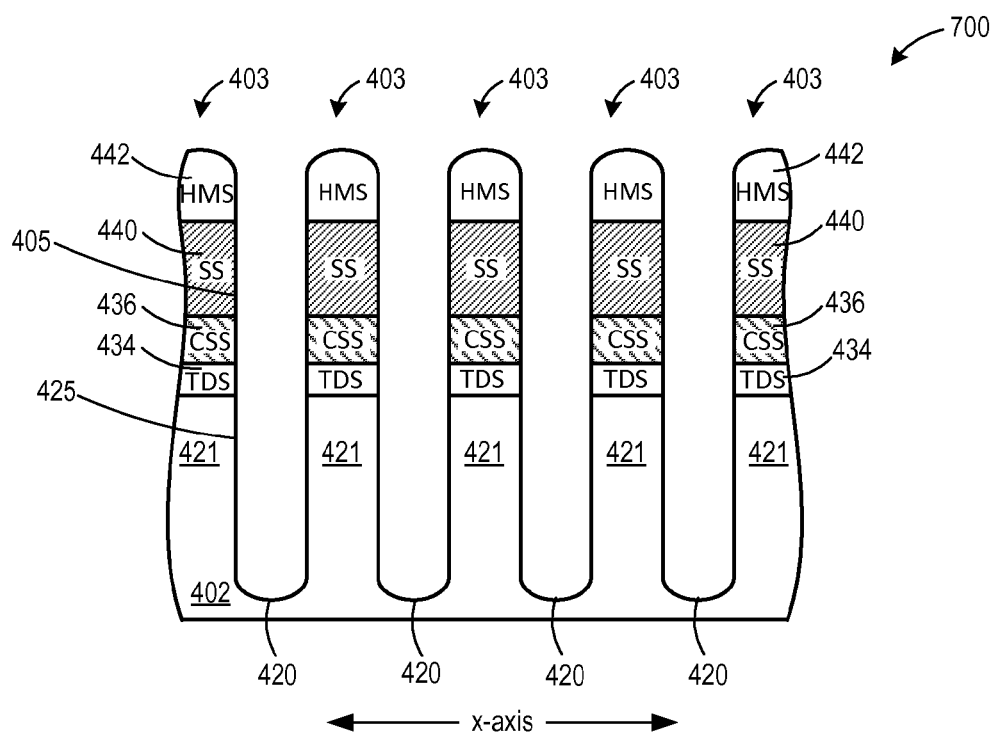

FIG. 10A is a cross-sectional view along the x-axis in the row or word line direction depicting memory array 700. Processing as described above is used to form a layer stack 401 over the substrate surface. In this embodiment, however, the intermediate dielectric layer 408 is not formed in layer stack 401. The layer stack includes tunnel dielectric layer 404, charge storage layer 406, sacrificial layer 410 and one or more hard masking layer(s) 412, but does not include the intermediate dielectric layer. Etching is applied as shown in FIG. 10B to form layer stack columns 403, each including tunnel dielectric strips 434, charge storage strips 436, sacrificial strips 440 and hard masking strips 442. Etching proceeds into the substrate to form isolation regions 420.

Figure 10C:
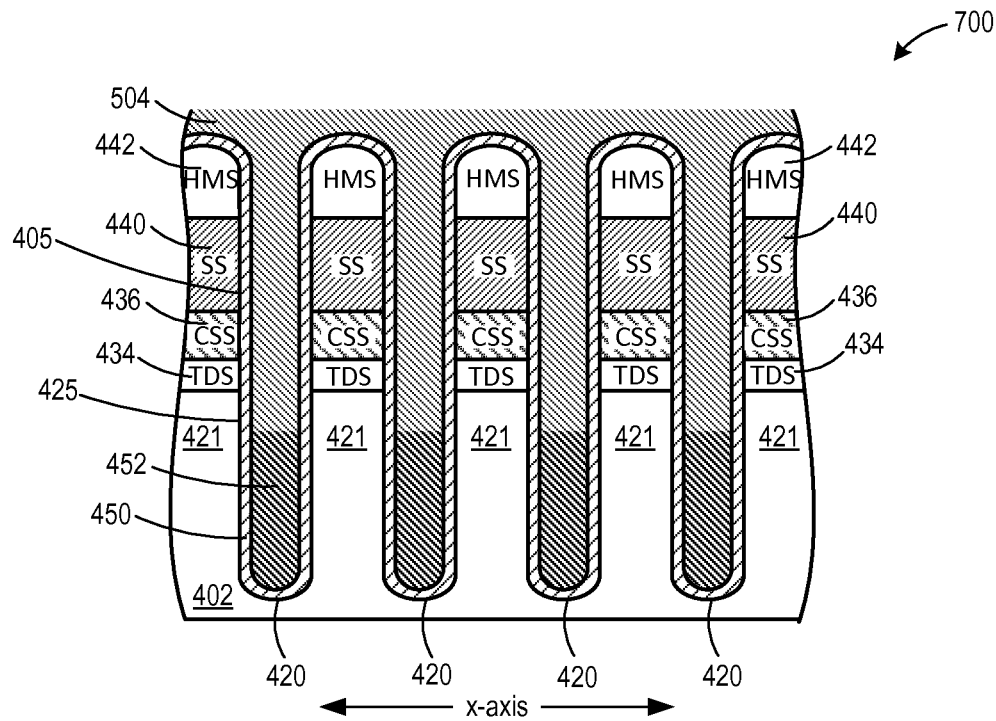
Figure 10D:
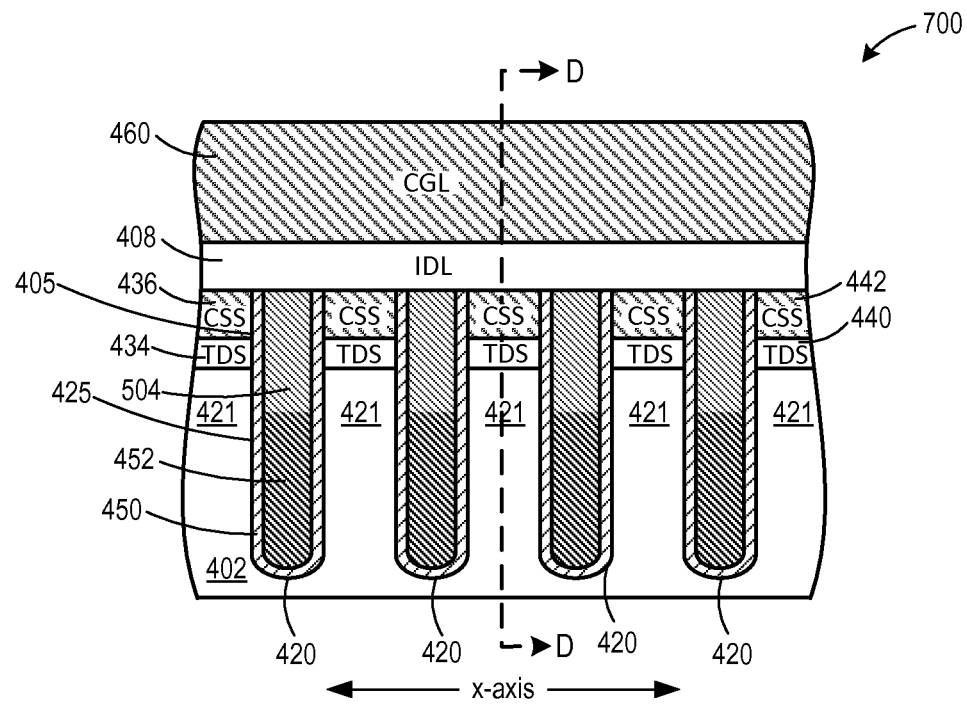

FIG. 10C depicts a dielectric liner 450, partial dielectric fill material 452 and sacrificial material 504 that can be formed as earlier described. After polishing and etching back until reaching the charge storage strips, the intermediate dielectric layer 408 is formed, followed by the control gate layer 460 as shown in FIG. 10D. Thus, the intermediate dielectric layer 408 is not etched using the first mask. In this manner, layer 408 extends continuously in the bit line and word line direction, overlying the charge storage regions as well as the isolation regions 420 between adjacent columns.

Figure 10E:
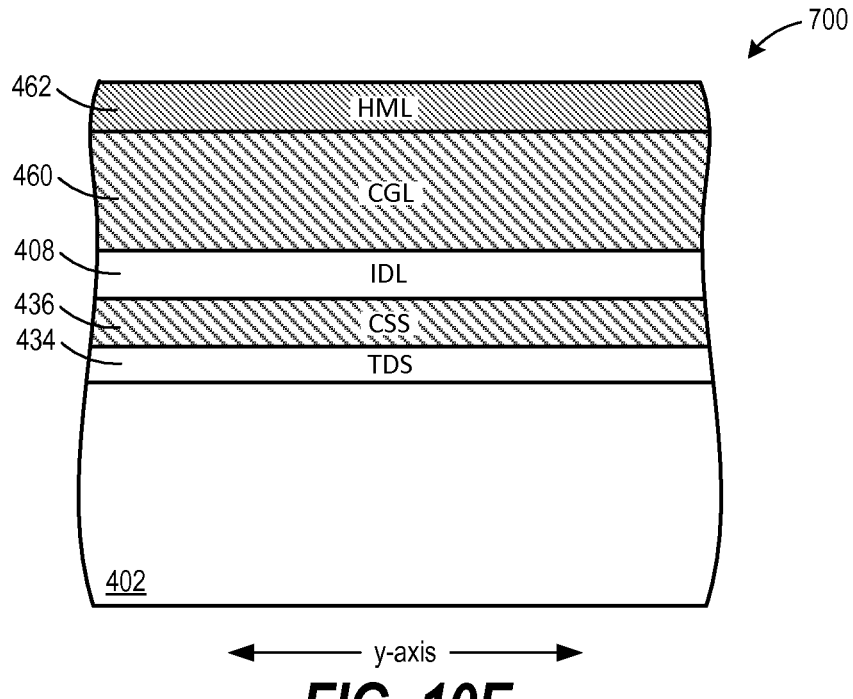
Figure 10F:
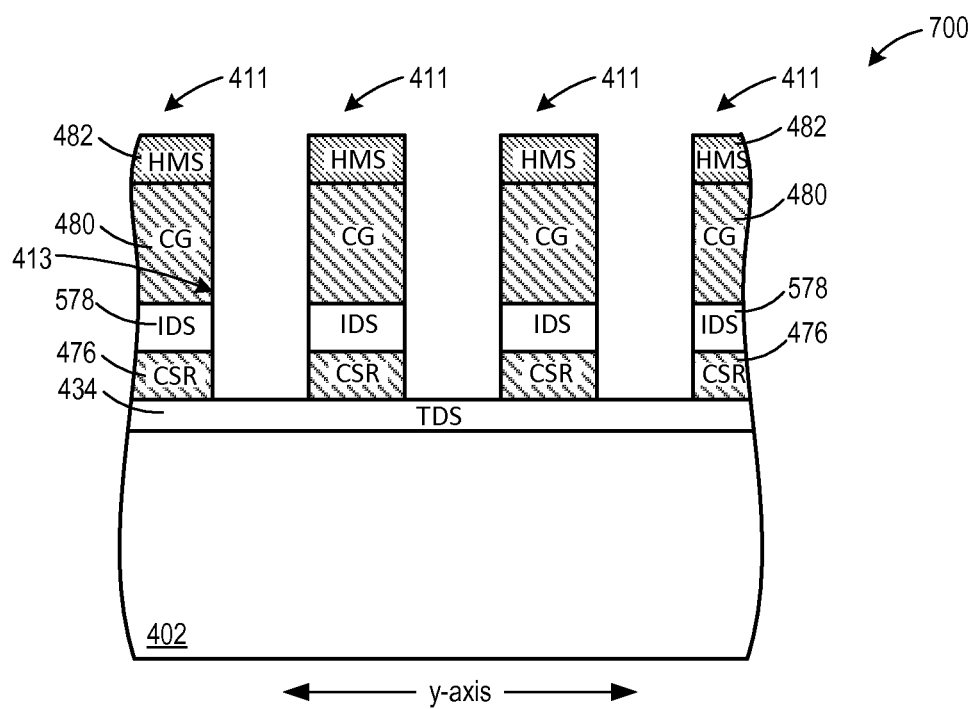

FIG. 10E is a cross-sectional view in the y-direction taken alone line D-D of FIG. 10D. A hard masking layer 462 is formed over the control gate layer 460. A second pattern is applied, followed by etching the layer stack as shown in FIG. 10F. Etching forms layer stack rows 411. Each row includes a charge storage region 476, intermediate dielectric strip 578, control gate 480 and hard mask strip 482. This can be contrasted with the layer stack rows 411 in FIG. 9F that include individual intermediate dielectric regions 478 at the intersection of each row and column.

Figure 10G:
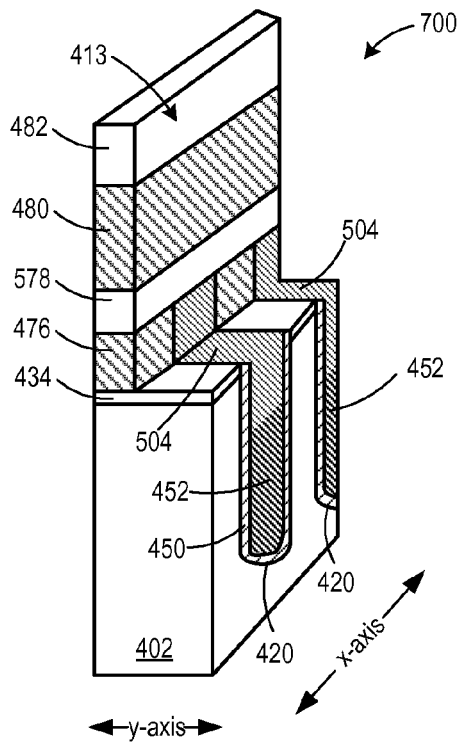
Figure 10H:
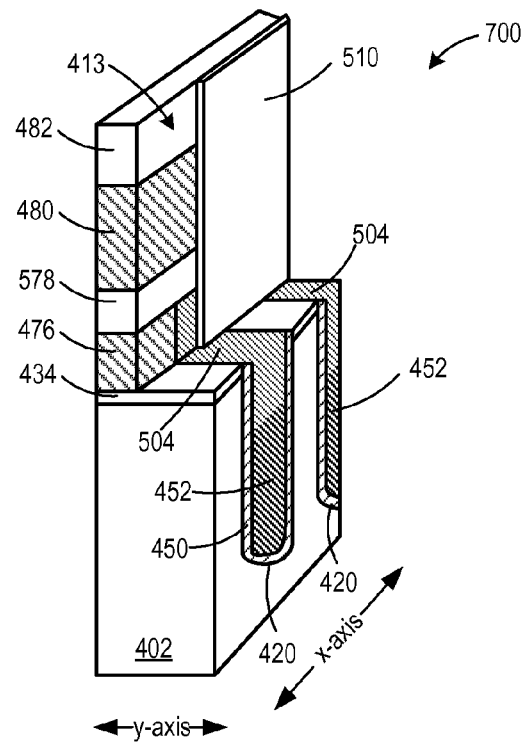
Figure 10I:
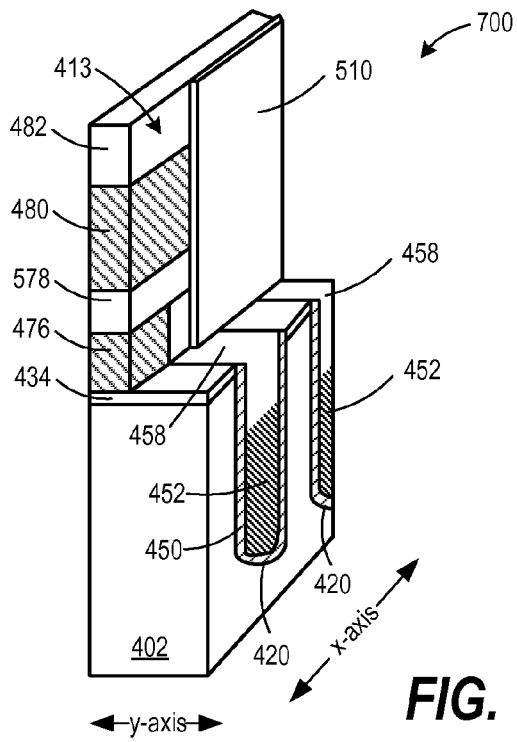

FIG. 10G is a perspective view corresponding to FIG. 10F. The intermediate dielectric layer 408 is formed into strips 578 that are continuous along the word line direction. This differs from the individual dielectric regions depicted in FIG. 9G. A dielectric sidewall spacer 510 is formed as shown in FIG. 10H. An etch is then used to remove the sacrificial material as shown in FIG. 10I. Removing the sacrificial material forms air gaps 458 that extend in the bit line direction. The air gaps are formed in isolation regions 420 and in the spaces above the substrate surface between adjacent layer stack columns 403. In this example, the air gaps extend vertically above the substrate surface to the lower surface of the intermediate dielectric strips 578. This can be contrasted with the air gaps in FIG. 9I which extend to the lower surface of the control gates, occupying the spaces between intermediate dielectric regions that are adjacent in the word line direction. Processing can then continue to form word line air gaps as shown in FIG. 7J

Figure 11:
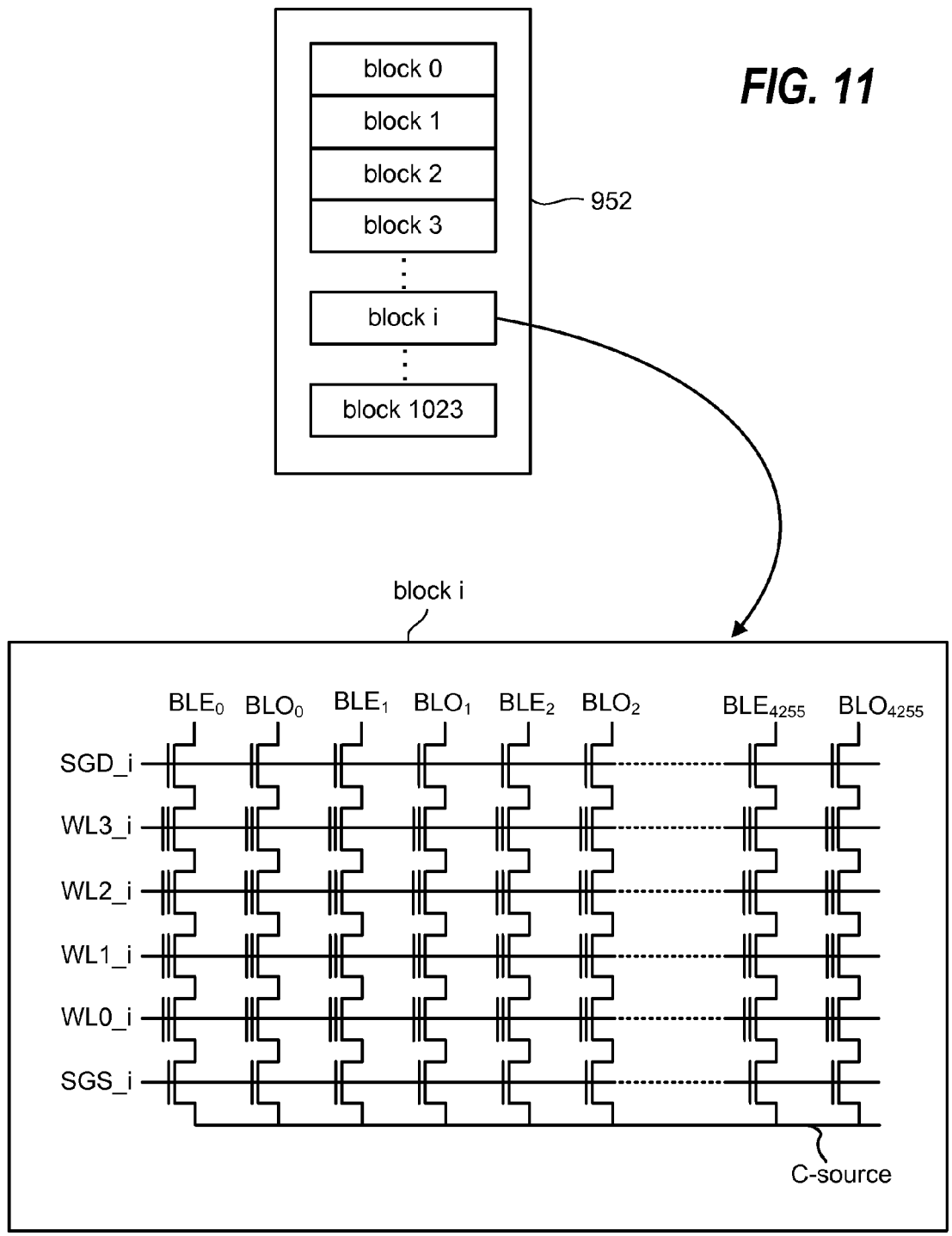
FIG. 11 depicts an example of the organization of a memory array in accordance with one embodiment.

FIG. 11 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 11 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 12:
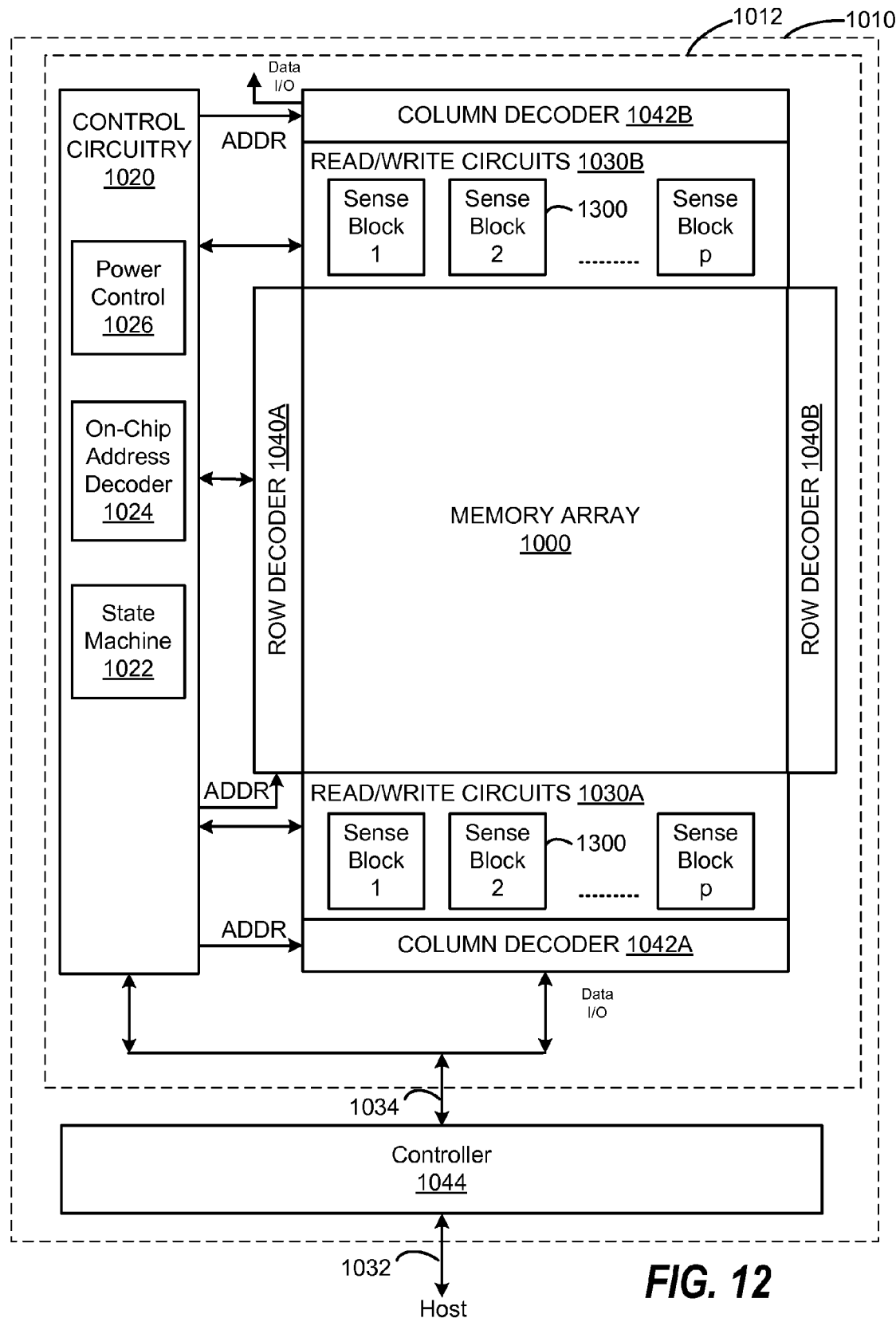
FIG. 12 is a block diagram depicting an example of a memory system that can be fabricated or used to implement embodiments of the disclosed technology.
Figure 13:
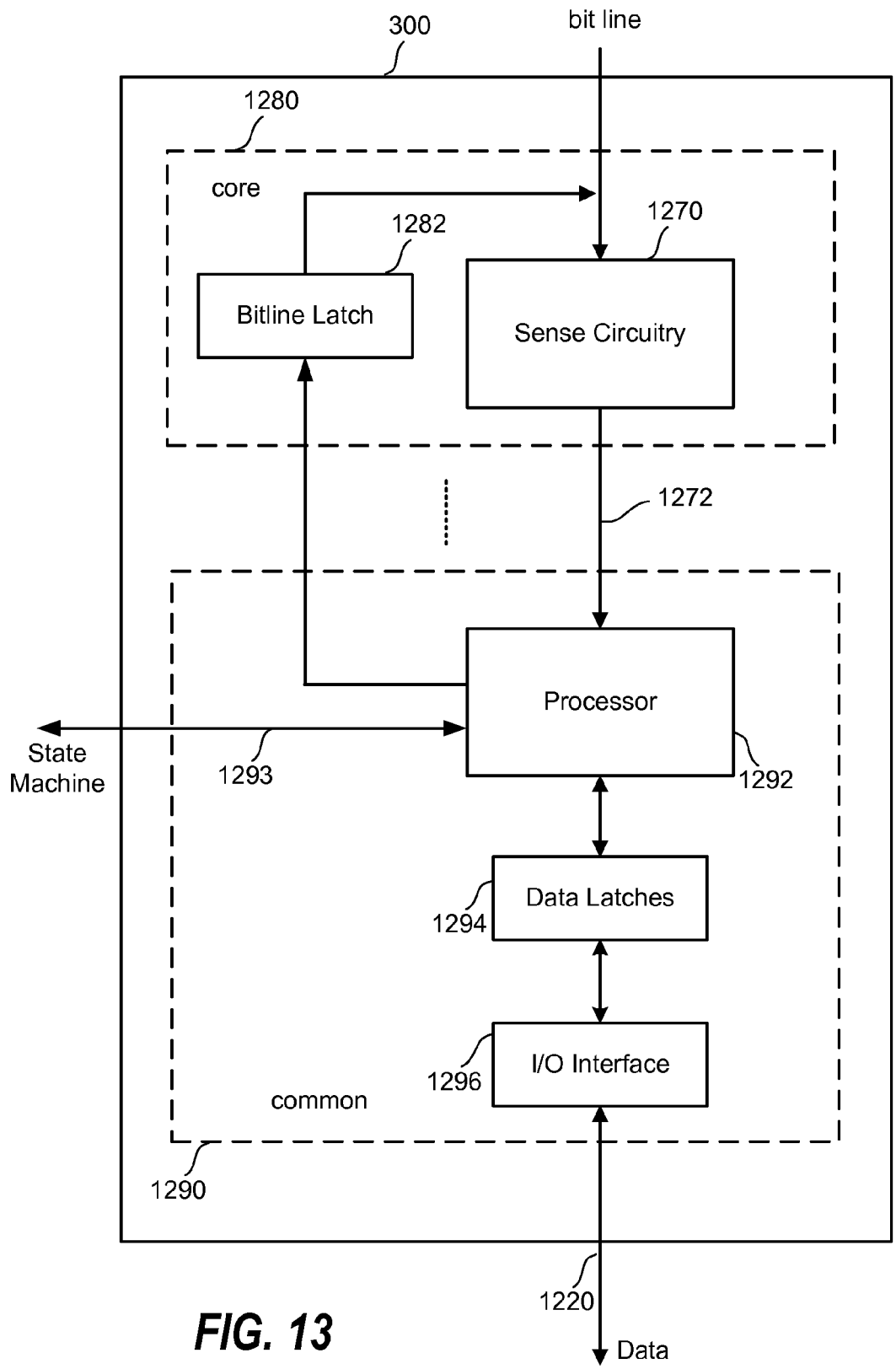
FIG. 13 is a block diagram depicting one embodiment of a sense block.

FIG. 12 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

FIG. 12 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

In one embodiment, a non-volatile memory array is provided that includes a first column of non-volatile storage elements formed over a first active area of a substrate, a second column of non-volatile storage elements formed over a second active area of the substrate, an isolation region in the substrate between the first active area and the second active area, and a bit line air gap in the isolation region.

In one embodiment, a method of fabricating non-volatile storage is provided that includes forming a first column of non-volatile storage elements over a first active area of a substrate, forming a second column of non-volatile storage elements over a second active area of the substrate, forming an isolation region in the substrate between the first active area and the second active area, forming an air gap in at least a portion of the isolation region.

In one embodiment, a non-volatile memory array is provided that includes a plurality of non-volatile storage elements arranged into rows and columns above a surface of a substrate, a plurality of isolation regions formed in the substrate between active areas of the substrate that underlie adjacent columns of non-volatile storage elements, a first plurality of air gaps formed in the plurality of isolation regions, and a second plurality of air gaps formed at least partially between adjacent rows of non-volatile storage elements.

In one embodiment, a method of fabricating non-volatile storage is provided that includes etching a layer stack to form a plurality of layer stack columns elongated in a column direction over a substrate, etching the substrate to define a plurality of isolation regions in the substrate that separate adjacent active areas of the substrate that underlie adjacent layer stack columns, forming an air gap in each isolation region, forming a control gate layer, etching the control gate layer to define a plurality of word lines elongated in a row direction orthogonal to the column direction, and etching the layer stack columns to define a row of charge storage regions under each word line.

In one embodiment, a method of fabricating non-volatile storage is provided that includes etching a layer stack to form a plurality of layer stack columns elongated in a first direction over a substrate with a space between layer stack columns adjacent in a second direction perpendicular to the first direction, forming a plurality of isolation regions in the substrate that are elongated in the first direction to define active areas in the substrate between isolation regions adjacent in the second direction, forming a dielectric liner in each isolation region, filling each isolation region and the spaces between layer stack columns with a dielectric material, recessing the dielectric material to below a level of a surface of the substrate, and forming a dielectric cap over each isolation region to define an air gap between a lower surface of each dielectric cap and an upper surface of the dielectric material in each isolation region.

In one embodiment, a method of fabricating non-volatile storage is provided that includes etching a layer stack that includes a tunnel dielectric layer and a charge storage layer to form a plurality of layer stack columns elongated in a first direction over a substrate with a space between layer stack columns adjacent in a second direction perpendicular to the first direction, forming a plurality of isolation regions in the substrate that are elongated in the first direction to define active areas between isolation regions adjacent in the second direction, partially filling each isolation region with a first dielectric material, forming a sacrificial film in at least a portion of each isolation region and in at least a portion of the spaces between layer stack columns, forming a control gate layer after forming the sacrificial film, etching the control gate layer into a plurality of word lines elongated in the second direction, etching the charge storage layer in the plurality of layer stack columns to form a plurality of columns of charge storage regions, and removing the sacrificial film after etching the charge storage layer to define a plurality of bit line air gaps.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile storage, comprising:
   etching a layer stack into a first layer stack column for a first column of non-volatile storage elements over a first active area of a substrate and a second layer stack column for
   a second column of non-volatile storage elements over a second active area of the substrate, wherein the first layer stack column includes a first tunnel dielectric strip, a first charge storage strip, and a first intermediate dielectric strip, wherein the second layer stack column includes a second tunnel dielectric strip, a second charge storage strip, and a second intermediate dielectric strip;
   forming an isolation region in the substrate between the first active area and the second active area;
   at least partially filling the isolation region with a sacrificial material;
   forming a control gate layer after at least partially filling the isolation region;
   etching the control gate layer, the first layer stack column and the second layer stack column, wherein etching forms a plurality of control gates from the control gate layer, a first plurality of charge storage regions from the first charge storage strip, and a second plurality of charge storage regions from the second charge storage strip; and
removing at least a portion of the sacrificial material after etching the control gate layer, the first layer stack column and the second layer stack column, wherein removing at least a portion of the sacrificial material forms a bit line air gap in at least a portion of the isolation region.

2. A method according to claim 1, further comprising:
etching the substrate to form the isolation region; and
recessing a first dielectric material within the isolation region, the dielectric material having an upper surface below a substrate surface of the substrate.

3. A method according to claim 2, wherein:
the first layer stack column includes a first strip of charge storage material separated from the substrate surface by a first strip of tunnel dielectric material;
the second layer stack column includes a second strip of charge storage material separated from the substrate surface by a second strip of tunnel dielectric material.

4. A method according to claim 1, wherein:
etching the control gate layer, the first layer stack column and the second layer stack column is orthogonal to a direction of etching a layer stack into the first layer stack column and the second layer stack column.

5. A method according to claim 4, wherein:
etching the control gate layer, the first layer stack column and the second layer stack column forms a plurality of layer stack rows including a first layer stack row and a second layer stack row;
the first layer stack row includes a first control gate, a first plurality of intermediate dielectric regions, and a first plurality of charge storage regions; and
the second layer stack row includes a second control gate, a second plurality of intermediate dielectric regions, and the second plurality of charge storage regions.

6. A method according to claim 5, further comprising:
forming a plurality of word line air gaps including a first word line air gap formed between the first layer stack row and the second layer stack row.

7. A method according to claim 6, wherein:
the first word line air gap extends vertically, with respect to the substrate surface, from a level above the substrate surface to at least a level of an upper surface of the first and second control gate.

8. A method according to claim 1, further comprising:
etching the substrate to form the isolation region;
wherein the plurality of control gates includes a first control gate overlying a first charge storage region of the first layer stack column and a first charge storage region of the second layer stack column; and
wherein the plurality of control gates includes a second control gate overlying a second charge storage region of the first layer stack column and a second charge storage region of the second layer stack column.

9. A method according to claim 1, further comprising, prior to removing at least a portion of the sacrificial material:
forming a sidewall film along a first and second sidewall of the plurality of control gates.

10. A method according to claim 9, further comprising:
forming a word line air gap between a first control gate and a second control gate.

11. A method according to claim 10, wherein:
the first control gate includes a sidewall separated from an adjacent sidewall of the second control gate by a first distance.

12. A method according to claim 11, wherein:
the word line air gap extends less than the first distance between the first control gate and the second control gate.

13. A method according to claim 12, wherein:
the word line air gap extends vertically, with respect to the substrate surface, from at least a level of a lower surface of the first charge storage regions to a level of an upper surface of the first control gate.

14. A method according to claim 1, wherein:
the first column of non-volatile storage elements is a first NAND string including two select gates; and
the second column of non-volatile storage elements is a second NAND string including two select gates.

15. A method of fabricating non-volatile storage, comprising:
forming a layer stack over a substrate, the layer stack including a tunnel dielectric layer and a charge storage layer; and
etching the layer stack into a first layer stack column overlying a first active area of the substrate for a first column of non-volatile storage elements and a second layer stack column overlying a second active area for a second column of non-volatile storage elements, the first layer stack column including a first tunnel dielectric strip and a first charge storage strip, the second layer stack column including a second tunnel dielectric strip and a second charge storage strip;
forming an isolation region in the substrate between the first active area and the second active area;
at least partially filling the isolation region with a sacrificial material;
forming a planar surface comprising an upper surface of the first charge storage strip, the second charge storage strip and the sacrificial material;
forming an intermediate dielectric layer after forming the planar surface;
forming a control gate layer after forming the intermediate dielectric layer;
etching the control gate layer into a plurality of control gates;
etching the intermediate dielectric layer into a plurality of strips, each intermediate dielectric strip underlying one of the control gates;
etching the first layer stack column including etching the first charge storage strip into a first plurality of charge storage regions; and
etching the second layer stack column including etching the second charge storage strip into a second plurality of charge storage regions;
forming a bit line air gap in at least a portion of the isolation region after etching the first layer stack column and the second layer stack column;
wherein a first control gate of the plurality overlies a first charge storage region of the first layer stack column and a first charge storage region of the second layer stack column; and
wherein a second control gate of the plurality overlies a second charge storage region of the first layer stack column and a second charge storage region of the second layer stack column.

16. A method according to claim 15, further comprising:
removing at least a portion of the sacrificial material after etching the first layer stack column and the second layer stack column, wherein removing the sacrificial material forms the bit line air gap in the isolation region.

17. A method according to claim 15, wherein:
the first column of non-volatile storage elements is a first NAND string including two select gates; and
the second column of non-volatile storage elements is a second NAND string including two select gates.

18. A method according to claim 15, further comprising, prior to removing at least a portion of the sacrificial material:
forming a sidewall film along a first and second sidewall of the first control gate and a first and second sidewall of the second control gate.

19. A method according to claim 18, further comprising:
forming a word line air gap between the first control gate and the second control gate.

20. A method according to claim 19, wherein:
the first control gate includes a sidewall separated from an adjacent sidewall of the second control gate by a first distance.

21. A method according to claim 20, wherein:
the word line air gap extends less than the first distance between the first control gate and the second control gate.

22. A method according to claim 21, wherein:
the word line air gap extends vertically, with respect to the substrate surface, from at least a level of a lower surface of the first charge storage regions to a level of an upper surface of the first control gate.

23. A method of fabricating non-volatile storage, comprising:
etching a layer stack to form a plurality of layer stack columns elongated in a column direction over a substrate, the layer stack including a tunnel dielectric layer and a charge storage layer;
etching the substrate to define a plurality of isolation regions in the substrate, the isolation regions separating adjacent active areas of the substrate that underlie adjacent layer stack columns;
at least partially filling the plurality of isolation regions with a sacrificial material;
forming a control gate layer after at least partially filling the plurality of isolation regions;
etching the control gate layer to define a plurality of word lines elongated in a row direction orthogonal to the column direction;
etching the layer stack columns to define a row of charge storage regions under each word line, each charge storage region including two sidewalls extending in the row direction; and
at least partially removing the sacrificial material from the isolation region after etching the control gate layer and the layer stack columns to form an air gap in each isolation region, the air gaps extend vertically, with respect to the substrate surface, from below a level of the substrate surface to at least a level of a lower surface of the control gate layer.

24. A method according to claim 23, wherein the air gap in each isolation region is a bit line air gap, the method further comprising:
forming a plurality of word line air gaps, each word line air gap elongated in the row direction and extending in the column direction at least a portion of a distance between the charge storage regions of adjacent rows.

25. A method according to claim 23, wherein:
the layer stack includes an intermediate dielectric layer.

26. A method according to claim 23, wherein:
the air gap in each isolation region extends above the substrate surface.

27. A method according to claim 23, wherein:
forming the control gate layer is performed before forming the air gap in each isolation region.

28. A method according to claim 23, further comprising:
forming a dielectric liner and a partial dielectric fill in each isolation region prior to forming the sacrificial material.

29. A method of fabricating non-volatile storage, comprising:
etching a layer stack to form a plurality of layer stack columns elongated in a first direction over a substrate with a space between layer stack columns adjacent in a second direction perpendicular to the first direction;
forming a plurality of isolation regions in the substrate, each isolation region elongated in the first direction to define active areas in the substrate between isolation regions adjacent in the second direction;
forming a dielectric liner in each isolation region;
filling each isolation region and the spaces between layer stack columns with a dielectric material;
recessing the dielectric material to below a level of a surface of the substrate;
forming a dielectric cap over each isolation region to define an air gap between a lower surface of each dielectric cap and an upper surface of the dielectric material in each isolation region;
forming a control gate layer after forming the dielectric cap over each isolation region;
etching the control gate layer to define a plurality of control gates extending in the second direction with spaces between word lines adjacent in the first direction;
etching the charge storage layer in the plurality of layer stack columns to define a row of charge storage regions under each control gate; and
forming an air gap elongated in the second direction between adjacent control gates.

30. A method according to claim 29, wherein:
the layer stack includes a tunnel dielectric layer, a charge storage layer and an intermediate dielectric layer.

31. A method according to claim 30, wherein:
each air gap extends vertically, with respect to a surface of the substrate, from a level above the substrate surface to at least a level of a lower surface of the control gates.

32. A method of fabricating non-volatile storage, comprising:
etching a layer stack to form a plurality of layer stack columns elongated in a first direction over a substrate with a space between layer stack columns adjacent in a second direction perpendicular to the first direction, the layer stack including a tunnel dielectric layer and a charge storage layer;
forming a plurality of isolation regions in the substrate, each isolation region elongated in the first direction to define an active area between isolation regions adjacent in the second direction;
partially filling each isolation region with a first dielectric material;
forming a sacrificial film in at least a portion of each isolation region and in at least a portion of the spaces between layer stack columns;
forming a control gate layer after forming the sacrificial film;
etching the control gate layer into a plurality of word lines elongated in the second direction;
etching the charge storage layer in the plurality of layer stack columns to form a plurality of columns of charge storage regions;

forming a protective layer along the vertical sidewalls of each word line and charge storage region; and removing the sacrificial film after forming the protective layer to define a plurality of bit line air gaps.

33. A method according to claim 32, wherein:

the layer stack includes an intermediate dielectric layer; and each bit line air gap extends from an upper surface of the first dielectric material in the corresponding isolation region to a lower surface of the control gate layer.

34. A method according to claim 32, further comprising:

forming an intermediate dielectric layer after forming the sacrificial film and before forming the control gate layer;

wherein each bit line air gap extends from an upper surface of the first dielectric material in the corresponding isolation region to a lower surface of the intermediate dielectric layer.

35. A method of fabricating non-volatile storage, comprising:

etching a layer stack into a first layer stack column overlying a first active area of a substrate and a second layer stack column overlying a second active area of the substrate, the first layer stack column includes a first tunnel dielectric strip and a first charge storage strip, the second layer stack column includes a second tunnel dielectric strip and a second charge storage strip;

forming an isolation region in the substrate between the first active area and the second active area;

at least partially filling the isolation region with a sacrificial material;

forming a planar surface comprising an upper surface of the first charge storage strip, the second charge storage strip, and the sacrificial material;

forming an intermediate dielectric layer after forming the planar surface;

forming a control gate layer after forming the intermediate dielectric layer;

in a first etch process, etching the control gate layer, the intermediate dielectric layer, the first layer stack column, and the second layer stack column into a plurality of layer stack rows; and in a second etch process after the first etch process, removing at least a portion of the sacrificial material to form a bit line air gap in the isolation region.

36. A method according to claim 35, wherein:

the first column of non-volatile storage elements is a first NAND string including two select gates; and the second column of non-volatile storage elements is a second NAND string including two select gates.

37. A method according to claim 35, further comprising, prior to removing at least a portion of the sacrificial material:

forming a sidewall film along a first and a second sidewall of each layer stack row.

38. A method according to claim 37, further comprising:

forming a word line air gap between adjacent layer stack rows.

* * * * *